US012666606B2

(12) United States Patent      (10) Patent No.:    US 12,666,606 B2
Noh et al.                      (45) Date of Patent:      Jun. 23, 2026

(54) SEMICONDUCTOR MEMORY DEVICE AND METHOD FOR FABRICATING THE SAME

(71) Applicant: Samsung Electronics Co., Ltd., Suwon-si (KR)

(72) Inventors: Ji Hun Noh, Suwon-si (KR); Beom Seo Kim, Suwon-si (KR); Sung Gil Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 784 days.

(21) Appl. No.: 18/067,390

(22) Filed: Dec. 16, 2022

(65) Prior Publication Data

US 2023/0328967 A1      Oct. 12, 2023

(30) Foreign Application Priority Data

Apr. 6, 2022    (KR) ........................ 10-2022-0042766

(51) Int. Cl.
H10B 12/00      (2023.01)
(52) U.S. Cl.
CPC ......... H10B 12/485 (2023.02); H10B 12/315 (2023.02); H10B 12/34 (2023.02)
(58) Field of Classification Search
CPC .... H10B 12/485; H10B 12/315; H10B 12/34; H10B 12/0335; H10B 12/482; H10B 12/02; H10B 12/053; H10B 12/488; H10B 12/50
USPC .............................................. 365/63, 230.06
See application file for complete search history.

(56) References Cited

U.S. PATENT DOCUMENTS

| | | | |
|---|---|---|---|
| 8,878,293 B2 | 11/2014 | Jang et al. | |
| 8,906,763 B2 | 12/2014 | Park et al. | |
| 8,969,936 B2 * | 3/2015 | Lee ........................ | H10B 12/48 |
| | | | 257/296 |
| 9,171,847 B1 | 10/2015 | Lee et al. | |
| 9,209,241 B2 | 12/2015 | Kim et al. | |
| 10,109,529 B2 | 10/2018 | Koh et al. | |
| 10,522,362 B2 | 12/2019 | Kim et al. | |

(Continued)

FOREIGN PATENT DOCUMENTS

| | | |
|---|---|---|
| CN | 114171519 A | 3/2022 |
| CN | 114256157 A | 3/2022 |
| KR | 2006/0056408 A | 5/2006 |

OTHER PUBLICATIONS

Taiwanese Office Action, dated Dec. 4, 2023, issued in corresponding Taiwanese Patent Application No. 112112660.

*Primary Examiner* — Michael T Tran
(74) *Attorney, Agent, or Firm* — Fish & Richardson P.C.

(57) ABSTRACT

A semiconductor memory device may include a substrate including an active area defined by an element isolation layer on the substrate, a word line crossing the active area and extending in a first direction, a bit line crossing the active area on the substrate and extending in a second direction, and a bit line contact directly connected to the bit line and the active area. The bit line contact may be between the substrate and the bit line. The bit line contact may include a lower bit line contact directly connected to the active area and an upper bit line contact on and in contact with the lower bit line contact. A width of an upper surface of the lower bit line contact in the second direction may be greater than a width of a lower surface of the upper bit line contact in the second direction.

20 Claims, 39 Drawing Sheets

(56)           References Cited

U.S. PATENT DOCUMENTS

| | | | |
|---|---|---|---|
| 2011/0115093 A1* | 5/2011 | Park | H01L 21/76877 257/773 |
| 2011/0169174 A1* | 7/2011 | Kim | H10D 64/256 257/784 |
| 2017/0025354 A1* | 1/2017 | Watanabe | H01L 21/76883 |
| 2022/0052057 A1* | 2/2022 | Song | H10B 12/053 |
| 2022/0262728 A1* | 8/2022 | Lee | H01L 21/76805 |
| 2022/0285358 A1* | 9/2022 | Lee | H10B 12/315 |
| 2022/0359400 A1* | 11/2022 | Lee | H01L 21/76834 |
| 2022/0384449 A1* | 12/2022 | Kim | H10B 12/315 |
| 2022/0406789 A1* | 12/2022 | Jeon | H10B 12/482 |
| 2023/0255021 A1* | 8/2023 | Kim | H10B 12/0335 257/296 |
| 2023/0309291 A1* | 9/2023 | Feng | H10B 12/482 |
| 2023/0320074 A1* | 10/2023 | Kim | H10B 12/482 257/296 |

* cited by examiner

SEMICONDUCTOR MEMORY DEVICE AND METHOD FOR FABRICATING THE SAME

CROSS-REFERENCE TO RELATED APPLICATION

This application claims priority from Korean Patent Application No. 10-2022-0042766, filed on Apr. 6, 2022 in the Korean Intellectual Property Office, and all the benefits accruing therefrom under 35 U.S.C. 119, the entire contents of which are herein incorporated by reference.

BACKGROUND

1. Technical Field

The present disclosure relates to a semiconductor memory device and a method of fabricating the same, and more particularly, to a semiconductor memory device having a plurality of wiring lines and node pads intersecting each other, and a method of fabricating the same.

2. Description of the Related Art

As semiconductor elements are increasingly highly integrated, individual circuit patterns are becoming more miniaturized in order to implement more semiconductor elements on the same area. That is, as the degree of integration of the semiconductor element increases, a design rule for the components of the semiconductor element is decreasing.

In a highly scaled semiconductor element, a process of forming a plurality of wiring lines and a plurality of buried contacts BC interposed therebetween may become increasingly complex and difficult.

SUMMARY

Aspects of the present disclosure provide a semiconductor memory device capable of improving reliability and performance.

Aspects of the present disclosure also provide a method for fabricating a semiconductor device capable of improving reliability and performance.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of inventive concepts, a semiconductor memory device may include a substrate; an element isolation layer on the substrate, the element isolation layer defining an active area of the substrate; a word line crossing the active area, the word line extending in a first direction; a bit line crossing the active area, the bit line extending in a second direction on the substrate, the second direction different from the first direction; and a bit line contact directly connected to the bit line and the active area, the bit line contact between the substrate and the bit line. The bit line contact may include a lower bit line contact directly connected to the active area and an upper bit line contact on the lower bit line contact. The lower bit line contact may be in contact with the upper bit line contact. A width of an upper surface of the lower bit line contact in the second direction may be greater than a width of a lower surface of the upper bit line contact in the second direction.

According to an embodiment of inventive concepts, a semiconductor memory device may include a substrate; an element isolation layer on the substrate, the element isolation layer defining an active area of the substrate, the active area of the substrate including a first portion and a second portion, the first portion at a central region of the active area, and the second portion at both sides of the active area; a bit line extending in a first direction on the substrate; a bit line contact between the substrate and the bit line, the bit line contact directly connected to the first portion of the active area, the bit line contact including a lower contact area and an upper contact area on the lower contact area; and a bit line spacer on the lower contact area of the bit line contact, the bit line spacer extending along a sidewall of the upper contact area of the bit line contact and a sidewall of the bit line. A width of the lower contact area in a second direction may be greater than a width of the upper contact area in the second direction at a boundary between the lower contact area and the upper contact area.

According to an embodiment of inventive concepts, a semiconductor memory device may include a substrate; an element isolation layer on the substrate, the element isolation layer defining an active area of the substrate, the active area extending in a first direction, the active area including a first portion and a second portion, the first portion at a central region of the active area, and the second portion at both sides of the active area; a word line on the substrate and the element isolation layer, the word line extending in a second direction and crossing between the first portion of the active area and the second portion of the active area; a bit line contact connected to the first portion of the active area; a node connection pad on the substrate and connected to the second portion of the active area; a bit line connected to the bit line contact and extending in a third direction, the bit line on the bit line contact; and a capacitor on the node connection pad and connected to the node connection pad. The bit line contact may include a lower bit line contact directly connected to the first portion of the active area and an upper bit line contact on the lower bit line contact. The lower bit line contact may be in contact with the upper bit line contact. A width of an upper surface of the lower bit line contact in the third direction may be greater than a width of a lower surface of the upper bit line contact in the third direction.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
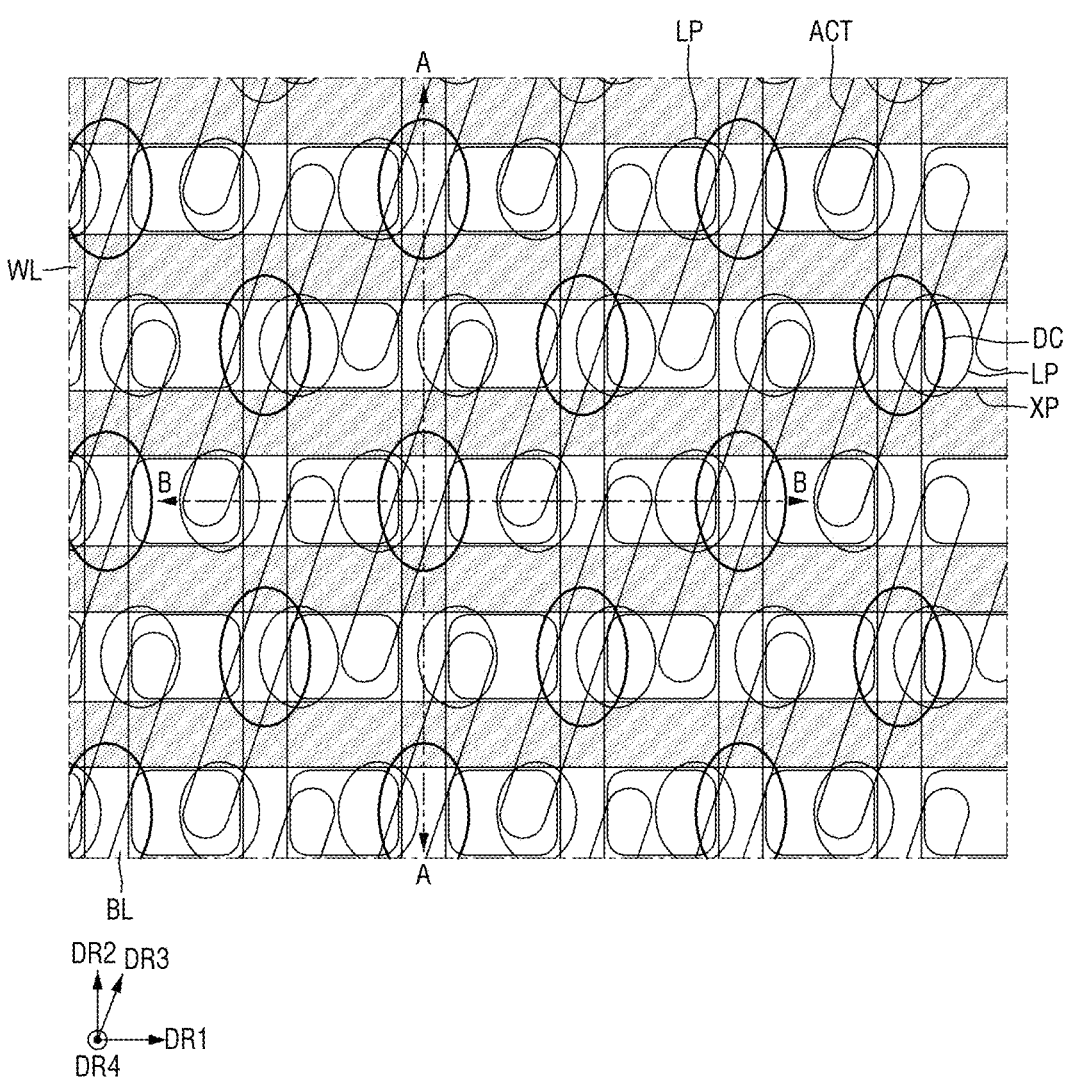
FIG. 1 is a schematic layout of a semiconductor memory device according to some example embodiments.
Figure 2:
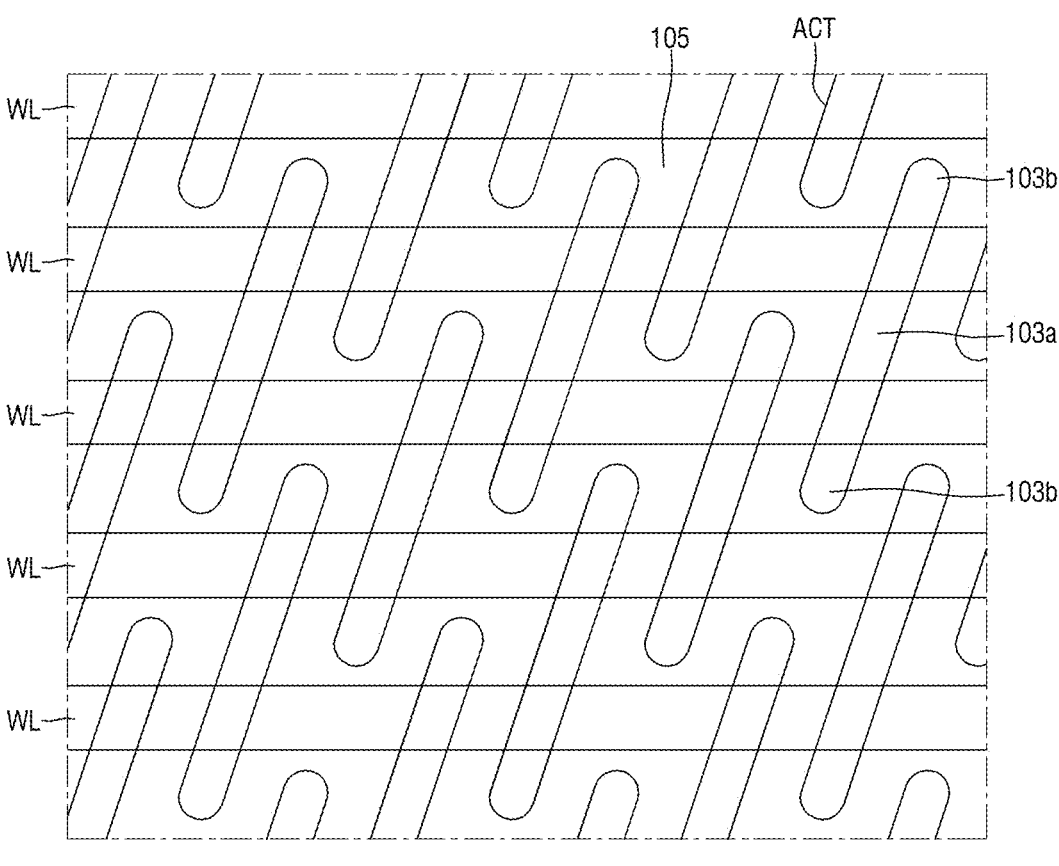
FIG. 2 is a layout illustrating only a word line and an active area of FIG. 1.
Figure 2:
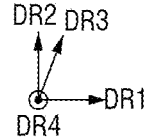
Figure 3:
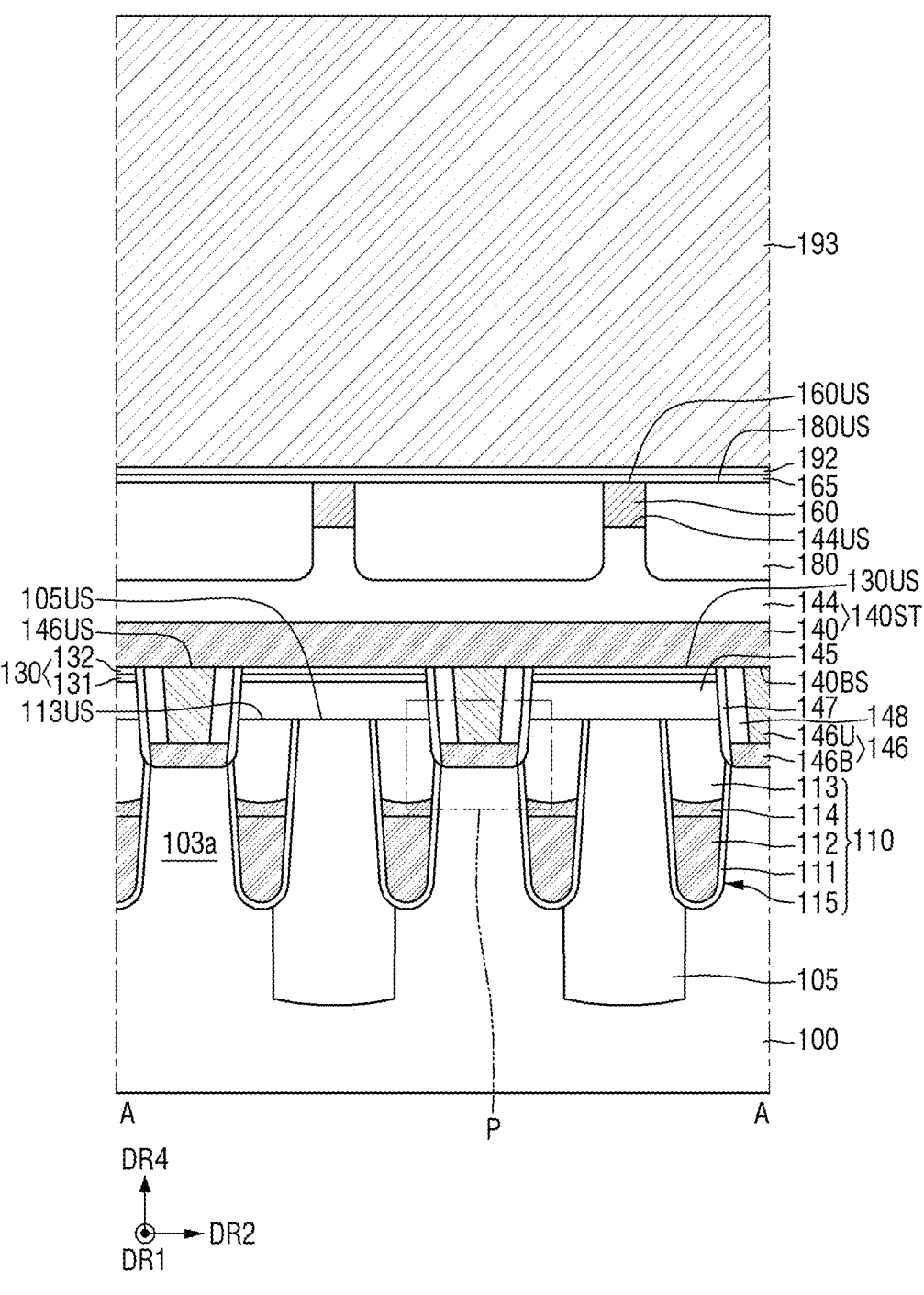
FIG. 3 is an example cross-sectional view taken along line A-A of FIG. 1.
Figure 4:
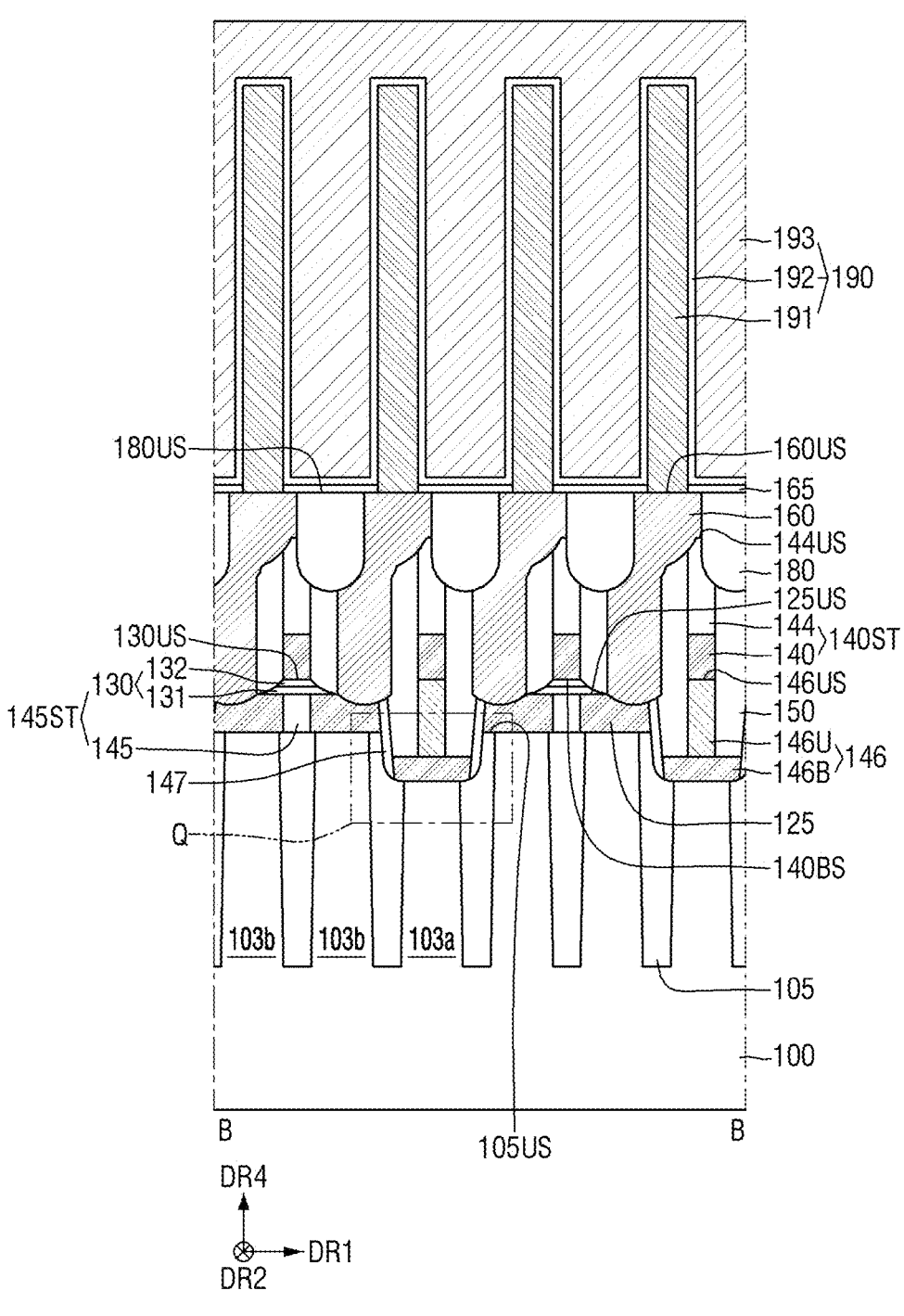
FIG. 4 is an example cross-sectional view taken along line B-B of FIG. 1.
Figure 5:
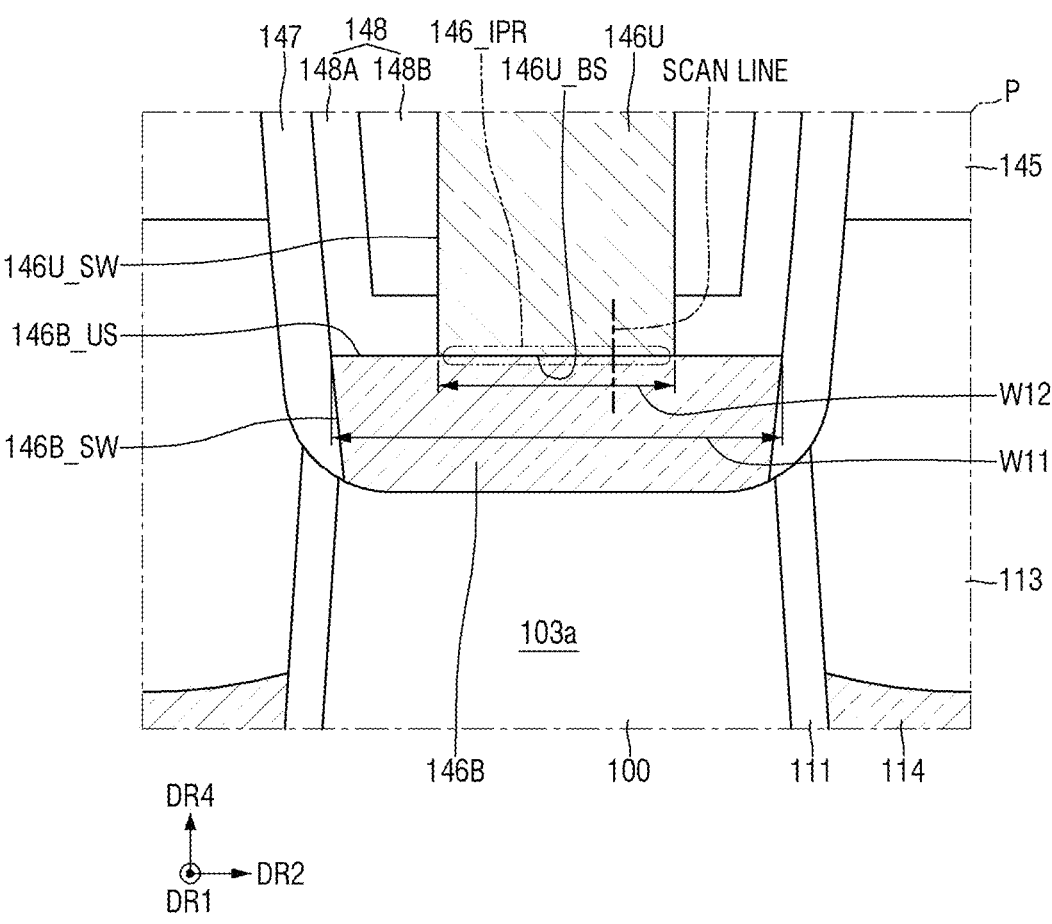
FIG. 5 is an enlarged view of part P of FIG. 3.
Figure 6:
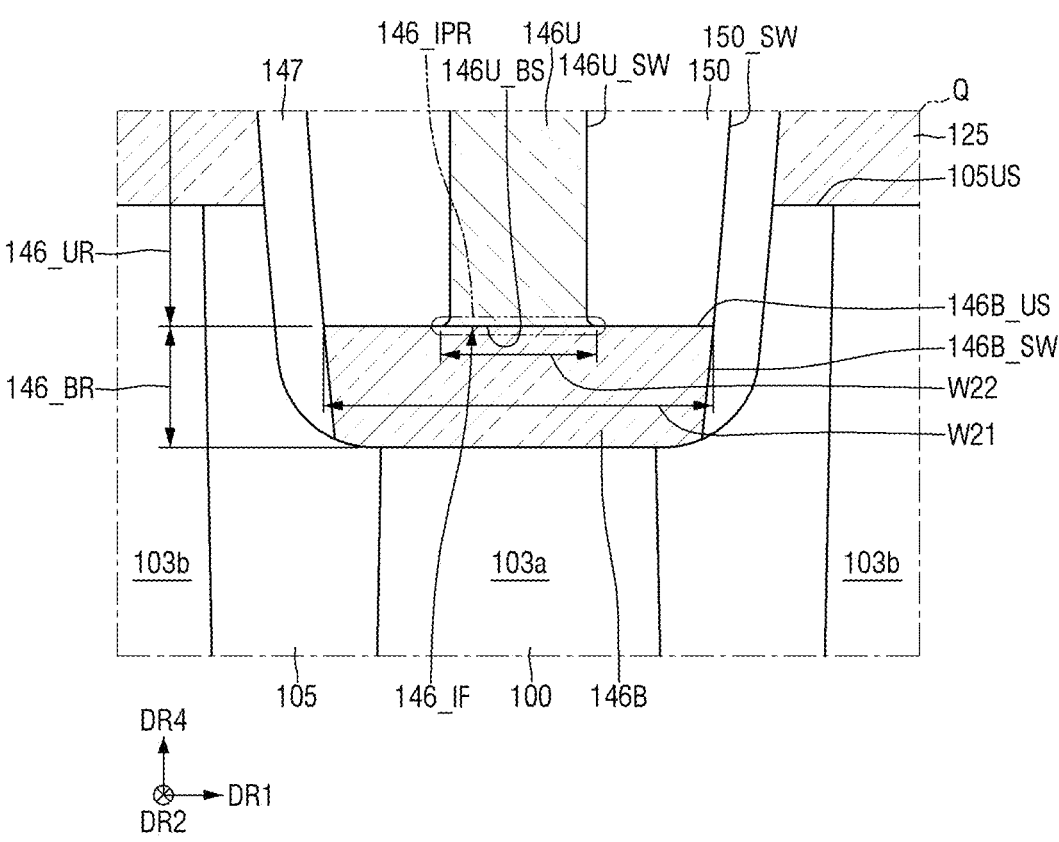
FIG. 6 is an enlarged view of part Q of FIG. 4.
Figure 7:
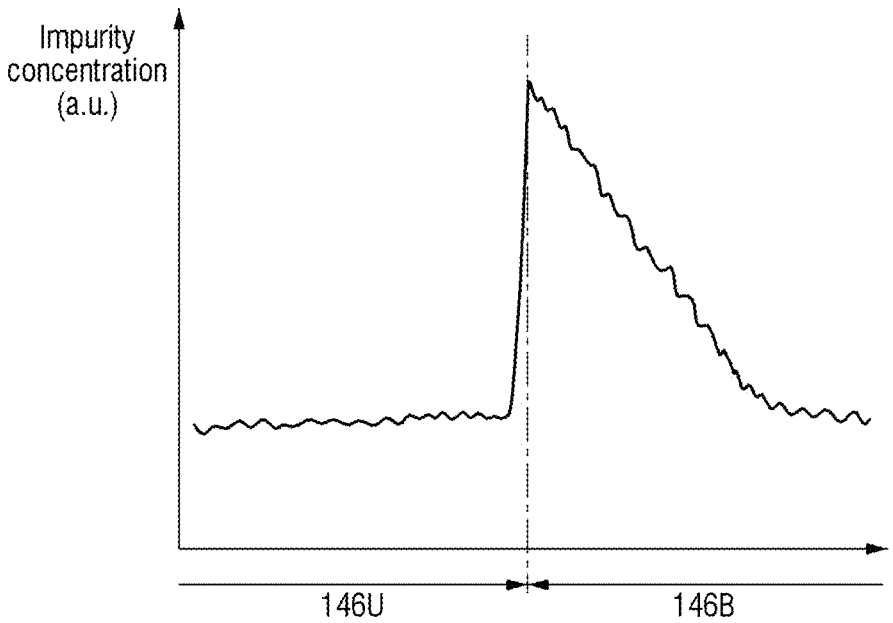
FIG. 7 is a view schematically illustrating an impurity concentration along a scan line of FIG. 5.

FIG. 1 is a schematic layout of a semiconductor memory device according to some example embodiments. FIG. 2 is a layout illustrating only a word line and an active area of FIG. 1. FIG. 3 is an example cross-sectional view taken along line A-A of FIG. 1. FIG. 4 is an example cross-sectional view taken along line B-B of FIG. 1. FIG. 5 is an enlarged view of part P of FIG. 3. FIG. 6 is an enlarged view of part Q of FIG. 4. FIG. 7 is a view schematically illustrating an impurity concentration along a scan line of FIG. 5.

In the drawings of a semiconductor memory device according to some example embodiments, a dynamic random access memory (DRAM) is illustrated, but the present disclosure is not limited thereto.

Referring to FIGS. 1 and 2, the semiconductor memory device according to some example embodiments may include a plurality of active areas ACT.

The cell active area ACT may be defined by a cell element isolation layer 105 formed in a substrate (100 in FIG. 3). As a design rule of the semiconductor memory device is reduced, the cell active area ACT may be disposed in a bar shape of a diagonal line or an oblique line as illustrated. For example, the cell active area ACT may extend in a third direction DR3.

A plurality of gate electrodes extending in the first direction DR1 across the cell active area ACT may be disposed. The plurality of gate electrodes may extend to be parallel to each other. The plurality of gate electrodes may be, for example, a plurality of word lines WL. The word lines WL may be disposed at equal intervals. A width of the word lines WL or an interval between the word lines WL may be determined according to a design rule.

Each cell active area ACT may be divided into three portions by two word lines WL extending in the first direction DR1. The cell active area ACT may include a storage connection portion 103*b* and a bit line connection portion 103*a*. The bit line connection portion 103*a* may be positioned at a central portion of the cell active area ACT, and the storage connection portion 103*b* may be positioned at an end portion of the cell active area ACT.

For example, the bit line connection portion 103*a* may be an area connected to a bit line BL, and the storage connection portion 103*b* may be an area connected to an information storage portion (190 in FIG. 4). In other words, the bit line connection portion 103*a* may correspond to a common drain area, and the storage connection portion 103*b* may correspond to a source area. Each word line WL and the bit line connection portion 103*a* and the storage connection portion 103*b* adjacent thereto may constitute a transistor.

A plurality of bit lines BL extending in a second direction DR2 orthogonal to the word line WL may be disposed on the word line WL. The plurality of bit lines BL may extend to be parallel to each other. The bit lines BL may be disposed at equal intervals. A width of the bit lines BL or an interval between the bit lines BL may be determined according to a design rule.

A fourth direction DR4 may be orthogonal to the first direction DR1, the second direction DR2, and the third direction DR3. The fourth direction DR4 may be a thickness direction of the substrate 100.

The semiconductor memory device according to some example embodiments may include various contact arrangements formed on the cell active area ACT. Various contact arrangements may include, for example, a direct contact DC, a node pad XP, a landing pad LP, and the like.

Here, the direct contact DC may refer to a contact electrically connecting the cell active area ACT to the bit line BL. The node pad XP may be a connection pad connecting the cell active area ACT to a lower electrode (191 in FIG. 4) of a capacitor. Due to an arrangement structure, a contact area between the node pad XP and the cell active area ACT may be small. Accordingly, a conductive landing pad LP may be introduced to increase a contact area with the cell active area ACT and a contact area with the lower electrode (191 in FIG. 4) of the capacitor.

The landing pad LP may be disposed between the node pad XP and the lower electrode (191 in FIG. 4) of the capacitor. By increasing the contact area through the introduction of the landing pad LP, contact resistance between the cell active area ACT and the lower electrode 191 of the capacitor may be reduced.

The direct contact DC may be connected to the bit line connection portion 103*a*. The node pad XP may be connected to the storage connection portion 103*b*.

As the node pad XP is disposed at both end portions of the cell active area ACT, the landing pad LP may be disposed adjacent to both ends of the cell active area ACT and at least partially overlap the node pad XP. In other words, the node pad XP may be formed to overlap the cell active area ACT and the cell element isolation layer (105 in FIG. 4) between the word lines WL adjacent to each other and between the bit lines BL adjacent to each other.

The word line WL may be formed in a structure buried in the substrate 100. The word line WL may be disposed across the cell active area ACT between the direct contact DC or the node pad XP. As illustrated, two word lines WL may be disposed across one cell active area ACT. As the cell active area ACT extends in the third direction DR3, the word line WL may have an angle of less than 90 degrees with the cell active area ACT.

The direct contact DC and the node pad XP may be symmetrically disposed. Accordingly, the direct contact DC and the node pad XP may be disposed on a straight line along the first direction DR1 and the second direction DR2. Meanwhile, unlike the direct contact DC and the node pad XP, the landing pad LP may be disposed in a zigzag shape in the second direction DR2 in which the bit line BL extends. In addition, the landing pad LP may be disposed to overlap the same side portion of each bit line BL in the first direction DR1 in which the word line WL extends.

For example, each of the landing pads LP of a first line may overlap a left side of a corresponding bit line BL, and each of the landing pads LP of a second line may overlap a right side of a corresponding bit line BL.

Referring to FIGS. 1 to 7, the semiconductor memory device according to some example embodiments may include a plurality of cell gate structures 110, a plurality of bit line structures 140ST, a plurality of node connection pads 125, a plurality of bit line contacts 146, and an information storage portion 190.

The substrate 100 may be a silicon substrate or a silicon-on-insulator (SOI). Unlike this, the substrate 100 may include silicon germanium, silicon germanium on insulator (SGOI), indium antimonide, lead tellurium compound, indium arsenide, indium phosphide, gallium arsenide, or gallium antimonide, but is not limited thereto.

The cell element isolation layer 105 may be formed in the substrate 100. The cell element isolation layer 105 may have a shallow trench isolation (STI) structure having excellent element isolation characteristics. The cell element isolation layer 105 may define the cell active area ACT in a memory cell area.

The cell active area ACT defined by the cell element isolation layer 105 may have a long island shape including a short axis and a long axis as illustrated in FIGS. 1 and 2. The cell active area ACT may have an oblique shape to have an angle of less than 90 degrees with respect to the word line WL formed in the cell element isolation layer 105. In addition, the cell active area ACT may have an oblique shape to have an angle of less than 90 degrees with respect to the bit line BL formed on the cell element isolation layer 105.

The cell element isolation layer 105 may include, for example, at least one of a silicon oxide layer, a silicon nitride layer, and a silicon oxynitride layer, but is not limited thereto.

The cell element isolation layer 105 is illustrated as being formed as a single insulating layer, but it is only for convenience of explanation and the present disclosure is not limited thereto. The cell element isolation layer 105 may be formed as a single insulating layer or a plurality of insulating layers according to a spaced distance between the cell active areas ACT adjacent to each other.

In FIGS. 4 and 6, an upper surface 105US of the cell element isolation layer and an upper surface of the substrate 100 are illustrated as being on the same plane, but this is only for convenience of explanation and the present disclosure is not limited thereto.

The cell gate structure 110 is formed in the substrate 100 and the cell element isolation layer 105. The cell gate structure 110 may be formed across the cell element isolation layer 105 and the cell active area ACT defined by the cell element isolation layer 105.

The cell gate structure 110 is formed in the substrate 100 and the cell element isolation layer 105. The cell gate structure 110 may include a cell gate trench 115, a cell gate insulating layer 111, a cell gate electrode 112, a cell gate capping pattern 113, and a cell gate capping conductive layer 114.

Here, the cell gate electrode 112 may correspond to the word line WL. For example, the cell gate electrode 112 may be the word line WL of FIG. 1. Alternatively, compared to as illustrated, the cell gate structure 110 may not include the cell gate capping conductive layer 114.

Although not illustrated, the cell gate trench 115 may be relatively deep in the cell element isolation layer 105 and relatively shallow in the cell active areas ACT. A bottom surface of the word line WL may be curved. That is, a depth of the cell gate trench 115 in the cell element isolation layer 105 may be greater than a depth of the cell gate trench 115 in the cell active area ACT.

The cell gate insulating layer 111 may extend along a sidewall and a bottom surface of the cell gate trench 115.

The cell gate insulating layer 111 may extend along a profile of at least a portion of the cell gate trench 115.

The cell gate insulating layer 111 may include, for example, at least one of silicon oxide, silicon nitride, silicon oxynitride, or a high-k material having a dielectric constant higher than that of silicon oxide. The high-k material may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof.

The cell gate electrode 112 may be disposed on the cell gate insulating layer 111. The cell gate electrode 112 may fill a portion of the cell gate trench 115. The cell gate capping conductive layer 114 may extend along an upper surface of the cell gate electrode 112.

The cell gate electrode 112 may include at least one of a metal, a metal alloy, conductive metal nitride, conductive metal carbonitride, conductive metal carbide, metal silicide, a doped semiconductor material, conductive metal oxynitride, and conductive metal oxide. The cell gate electrode 112 may include, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and a combination thereof, but is not limited thereto.

The cell gate capping conductive layer 114 may include, for example, one of polysilicon, polysilicon-germanium, amorphous silicon, and amorphous silicon-germanium, but is not limited thereto.

The cell gate capping pattern 113 may be disposed on the cell gate electrode 112 and the cell gate capping conductive layer 114. The cell gate capping pattern 113 may fill the cell gate trench 115 remaining after the cell gate electrode 112 and the cell gate capping conductive layer 114 are formed. The cell gate insulating layer 111 is illustrated as extending along sidewalls of the cell gate capping pattern 113, but is not limited thereto.

The cell gate capping pattern 113 may include, for example, at least one of silicon nitride (SiN), silicon oxynitride (SiON), silicon oxide (SiO$_2$), silicon carbonitride (SiCN), silicon oxycarbonitride (SiOCN), and a combination thereof.

In FIG. 3, an upper surface 113US of the cell gate capping pattern is illustrated as being on the same plane as the upper surface 105US of the cell device isolation layer, but is not limited thereto.

Although not illustrated, an impurity doped area may be formed on at least one side of the cell gate structure 110. The impurity doped area may be a source/drain area of a transistor. The impurity doped area may be formed in the storage connection portion 103b and the bit line connection portion 103a of FIG. 2.

In FIG. 2, when the transistor including each word line WL and the bit line connection portion 103a and the storage connection portion 103b adjacent thereto is an n-channel metal oxide semiconductor (NMOS), the storage connection portion 103b and the bit line connection portion 103a may include at least one of doped n-type impurities, for example, phosphorus (P), arsenic (As), antimony (Sb), and bismuth (Bi). When the transistor including each word line WL and the bit line connection portion 103a and the storage connection portion 103b adjacent thereto is a p-channel metal oxide semiconductor (PMOS), the storage connection portion 103*b* and the bit line connection portion 103*a* may include doped p-type impurities, for example, boron (B)

The bit line structure 140ST may include a cell conductive line 140 and a cell line capping layer 144. The cell conductive line 140 may be disposed on the substrate 100 and the cell element isolation layer 105 in which the cell gate structure 110 is formed. The cell conductive line 140 may intersect the cell element isolation layer 105 and the cell active area ACT defined by the cell element isolation layer 105. The cell conductive line 140 may be formed to intersect the cell gate structure 110. Here, the cell conductive line 140 may correspond to the bit line BL. For example, the cell conductive line 140 may be the bit line BL of FIG. 1.

The cell conductive line 140 may include, for example, at least one of a semiconductor material doped with impurities, a conductive silicide compound, conductive metal nitride, a two-dimensional (2D) material, a metal, and a metal alloy. In the semiconductor memory device according to some example embodiments, the 2D material may be a metallic material and/or a semiconductor material. The 2D material may include a two-dimensional allotrope or a two-dimensional compound, and may include, for example, at least one of graphene, molybdenum disulfide ($MoS_2$), molybdenum diselenide ($MoSe_2$), tungsten diselenide ($WSe_2$), and tungsten disulfide ($WS_2$), but is not limited thereto. That is, since the above-described 2D material is only listed as an example, the 2D material that may be included in the semiconductor memory device of the present disclosure is not limited by the above-described material.

The cell conductive line 140 is illustrated as a single layer, but it is only for convenience of explanation and the present disclosure is not limited thereto. That is, in some embodiments although not shown, the cell conductive line 140 may include a plurality of conductive layers on which a conductive material is stacked.

The cell line capping layer 144 may be disposed on the cell conductive line 140. The cell line capping layer 144 may extend in the second direction DR2 along the upper surface of the cell conductive line 140. The cell line capping layer 144 may include, for example, at least one of a silicon nitride layer, silicon oxynitride, silicon carbonitride, and silicon oxycarbonitride.

In the semiconductor memory device according to some example embodiments, the cell line capping layer 144 may include a silicon nitride layer. The cell line capping layer 144 is illustrated as a single layer, but is not limited thereto.

The bit line contact 146 may be formed between the cell conductive line 140 and the substrate 100. The cell conductive line 140 may be disposed on the bit line contact 146.

The bit line contact 146 may be disposed between the bit line connection portion 103*a* of the cell active area ACT and the cell conductive line 140. The bit line contact 146 may be disposed between the cell gate electrodes 112 adjacent to each other in the second direction DR2. The bit line contact 146 may be directly connected to the bit line connection portion 103*a*.

In plan view, the bit line contact 146 may have a circular or elliptical shape. A planar area of the bit line contact 146 may be greater than an overlapping area of the bit line connection portion 103*a* and one cell conductive line 140. The planar area of the bit line contact 146 may be greater than that of one bit line connection portion 103*a*.

The bit line contact 146 may electrically connect the cell conductive line 140 and the substrate 100 to each other. Here, the bit line contact 146 may correspond to the direct contact DC.

The bit line contact 146 includes a lower bit line contact 146B and an upper bit line contact 146U. The lower bit line contact 146B is directly connected to the upper bit line contact 146U.

The lower bit line contact 146B is connected to the substrate 100. The lower bit line contact 146B is directly connected to the bit line connection portion 103*a*.

The upper bit line contact 146U is disposed on the lower bit line contact 146B. The upper bit line contact 146U is in contact with the lower bit line contact 146B. A lower surface 146U_BS of the upper bit line contact is directly connected to an upper surface 146B_US of the lower bit line contact.

The bit line contact 146 may include an upper surface 146US connected to the cell conductive line 140. The upper surface 146US of the bit line contact is included in the upper bit line contact 146U.

The lower bit line contact 146B includes a semiconductor material. The lower bit line contact 146B includes a semiconductor epitaxial pattern formed using an epitaxial growth method.

The upper bit line contact 146U includes a semiconductor material. The upper bit line contact 146U may include one of a polycrystalline semiconductor material, an amorphous semiconductor material, and a single crystal semiconductor material.

The bit line contact 146 may further include an impurity pile-up area 146_IPR. The impurity pile-up area 146_IPR is formed in the bit line contact 146.

The impurity pile-up area 146_IPR may be formed near an interface between the upper bit line contact 146U and the lower bit line contact 146B. The impurity pile-up area 146_IPR may be formed along the interface between the upper bit line contact 146U and the lower bit line contact 146B.

The impurity pile-up area 146_IPR may be an area in which more pile-up impurities are piled up than other areas of the bit line contact 146. The impurity pile-up area 146_IPR may be an area in which the pile-up impurities are piled up.

FIG. 7 does not mean that an area of the bit line contact 146 other than the impurity file-up area 146_IPR does not include the file-up impurities. The pile-up impurities may include, for example, at least one of carbon and nitrogen, but is not limited thereto.

In a manufacturing process of forming the upper bit line contact 146U, a silicon precursor including carbon or nitrogen may be used for the upper bit line contact 146U. In this case, the pile-up impurities piled up in the impurity pile-up area 146_IPR may include, for example, at least one of carbon or nitrogen.

In FIG. 7, the pile-up impurity may rapidly increase at the interface between the upper bit line contact 146U and the lower bit line contact 146B. In addition, a concentration of the pile-up impurity in the lower bit line contact 146B may gradually decrease as a distance from the lower surface 146U_BS of the upper bit line contact increases.

The interface between the upper bit line contact 146U and the lower bit line contact 146B is illustrated as being distinguished, but the present disclosure is not limited thereto. Alternatively, compared to as illustrated, the interface between the upper bit line contact 146U and the lower bit line contact 146B may not be distinguished.

However, since the impurity pile-up area 146_IPR may be identified through component analysis, the interface between the upper bit line contact 146U and the lower bit line contact 146B may be identified through the impurity pile-up area 146_IPR.

In FIGS. 3 and 5, a width W11 of the upper surface 146B_US of the lower bit line contact in the second direction DR2 is greater than a width W12 of the lower surface 146U_BS of the upper bit line contact in the second direction DR2. The width W11 of the upper surface 146B_US of the lower bit line contact in the second direction DR2 is greater than a width of the upper surface 146US of the bit line contact in the second direction DR2.

In the semiconductor memory device according to some example embodiments, the upper surface 146B_US of the lower bit line contact may be a flat surface. Here, the upper surface 146B_US of the lower bit line contact may have a shape illustrated in a cross-sectional view as illustrated in FIG. 3.

In FIGS. 4 and 6, the bit line contact 146 may include a lower contact area 146_BR and an upper contact area 146_UR. The bit line contact 146 may include an area boundary 146_IF defined between the lower contact area 146_BR and the upper contact area 146_UR. The area boundary 146_IF of the bit line contact may be defined in a cross-sectional view taken in the first direction DR1. The area boundary 146_IF of the bit line contact may be defined based on the lowermost portion of a bit line spacer 150, which will be described later.

At the area boundary 146_IF of the bit line contact, a width W21 of the lower contact area 146_BR in the first direction DR1 is greater than a width W22 of the upper contact area 146_UR in the first direction DR1. For example, the lower contact area 146_BR may include the lower bit line contact 146B and may not include the upper bit line contact 146U. The upper contact area 146_UR may include the upper bit line contact 146U and may not include the lower bit line contact 146B. A sidewall of the lower contact area 146_BR may be a sidewall 146B_SW of the lower bit line contact, and a sidewall of the upper contact area 146_UR may be a sidewall 146U_SW of the upper bit line contact. The area boundary 146_IF of the bit line contact may be an interface between the upper bit line contact 146U and the lower bit line contact 146B.

The node connection pad 125 may be disposed on the substrate 100. The node connection pad 125 may be disposed on the storage connection portion 103b of the cell active area ACT. The node connection pad 125 is connected to the storage connection portion 103b.

The node connection pad 125 may be disposed between the cell conductive lines 140 adjacent to each other in the first direction DR1. Although not illustrated, the node connection pad 125 may be disposed between the cell gate electrodes 112 adjacent to each other in the second direction DR2.

Based on the upper surface 105US of the cell element isolation layer, an upper surface 125US of the node connection pad is lower than the upper surface 146US of the bit line contact. Based on the upper surface 105US of the cell element isolation layer, the upper surface 125US of the node connection pad is lower than the lower surface 140BS of the cell conductive line.

The node connection pad 125 may electrically connect the information storage portion 190 and the substrate 100 to each other. Here, the node connection pad 125 may correspond to the node pad XP. The node connection pad 125 may include, for example, at least one of a semiconductor material doped with impurities, a conductive silicide compound, conductive metal nitride, a metal, and a metal alloy.

A pad isolation structure 145ST may isolate the node connection pads 125 adjacent to each other in the first direction DR1. Although not illustrated, the pad isolation structure 145ST may isolate the node connection pads 125 adjacent to each other in the second direction DR2. The pad isolation structure 145ST covers the upper surface 125US of the node connection pad.

The pad isolation structure 145ST may include a pad isolation pattern 145 and an upper cell insulating layer 130. The upper cell insulating layer 130 may be disposed on the pad isolation pattern 145.

When the node connection pad 125 includes a first node connection pad and a second node connection pad spaced apart from each other in the first direction DR1, the pad isolation pattern 145 may isolate the first node connection pad and the second node connection pad from each other in the first direction DR1. Although not illustrated, the pad isolation pattern 145 may also isolate the node connection pads 125 adjacent to each other in the second direction DR2.

The upper cell insulating layer 130 covers the upper surface 125US of the node connection pad. When the node connection pad 125 includes the first node connection pad and the second node connection pad spaced apart from each other in the first direction DR1, the upper cell insulating layer 130 may cover an upper surface of the first node connection pad and an upper surface of the second node connection pad.

An upper surface 130US of the upper cell insulating layer may be on the same plane as the upper surface 146US of the bit line contact. That is, based on the upper surface 105US of the cell element isolation layer, a height of the upper surface 130US of the upper cell insulating layer may be the same as a height of the upper surface 146US of the bit line contact.

The pad isolation pattern 145 and the upper cell insulating layer 130 may be disposed between the bit line contacts 146 adjacent to each other in the second direction DR2. The cell conductive line 140 may be disposed on the upper surface of the pad isolation structure 145ST. The cell conductive line 140 may be disposed on the upper surface 130US of the upper cell insulating layer. The upper surface of the pad isolation structure 145ST may be the upper surface 130US of the upper cell insulating layer. The upper surface of the pad isolation structure 145ST may be on the same plane as the lower surface 140BS of the cell conductive line. The lower surface BS of the cell conductive line may be on the same plane as the upper surface 146US of the bit line contact.

The pad isolation pattern 145 may include, for example, at least one of silicon nitride (SiN), silicon oxynitride (SiON), silicon oxide (SiO₂), silicon carbonitride (SiCN), silicon oxycarbonitride (SiOCN), and a combination thereof.

The upper cell insulating layer 130 may be a single layer, but as illustrated, the upper cell insulating layer 130 may be a multilayer including a first upper cell insulating layer 131 and a second upper cell insulating layer 132. For example, the first upper cell insulating layer 131 may include a silicon oxide layer, and the second upper cell insulating layer 132 may include a silicon nitride layer, but the present disclosure is not limited thereto. A width of the upper cell insulating layer 130 in the first direction DR1 is illustrated as decreasing as a distance from the substrate 100 increases, but the present disclosure is not limited thereto.

The bit line spacer 150 may be disposed on sidewalls of the cell conductive line 140 and the cell line capping layer 144.

In the portion of the cell conductive line 140 on which the bit line contact 146 is formed, the bit line spacer 150 may be disposed on the sidewalls of the cell conductive line 140, the cell line capping layer 144, and the bit line contact 146.

In FIGS. 4 and 6, the bit line spacer 150 may be disposed on the sidewall of the cell conductive line 140, the sidewall of the cell line capping layer 144, and the sidewall of the upper contact area 146_UR. The bit line spacer 150 is disposed on the lower contact area 146_BR. The lower contact area 146_BR is positioned on a lower side of the bit line spacer 150. The bit line spacer 150 overlaps the lower contact area 146_BR in the fourth direction DR4.

In the remaining portion of the cell conductive line 140 on which the bit line contact 146 is not formed, the bit line spacer 150 may be disposed on the upper cell insulating layer 130.

The bit line spacer 150 is illustrated as a single layer, but it is only for convenience of explanation and the present disclosure is not limited thereto. That is, in some embodiments although not shown, the bit line spacer 150 may also have a multilayer structure. The bit line spacer 150 may include, for example, one of a silicon oxide layer, a silicon nitride layer, a silicon oxynitride layer (SiON), a silicon oxycarbonitride layer (SiOCN), air, and a combination thereof, but is not limited thereto.

A first bit line contact spacer 147 is disposed on the sidewall 146B_SW of the lower bit line contact. The first bit line contact spacer 147 is in contact with the sidewall 146B_SW of the lower bit line contact. In the semiconductor memory device according to some example embodiments, the entire sidewall 146B_SW of the lower bit line contact may be in contact with the first bit line contact spacer 147.

In FIGS. 3 and 5, the first bit line contact spacer 147 may be disposed between the bit line contact 146 and the pad isolation pattern 145. The first bit line contact spacer 147 may protrude in the fourth direction DR4 than the upper surface 146B_US of the lower bit line contact. The first bit line contact spacer 147 is illustrated as extending up to the lower surface 140BS of the cell conductive line, but the present disclosure is not limited thereto.

In FIGS. 4 and 6, the first bit line contact spacer 147 may extend along the sidewall 146B_SW of the lower bit line contact and a sidewall 150_SW of the bit line spacer. The bit line spacer 150 may be disposed between the first bit line contact spacer 147 and the upper contact area 146_UR.

The first bit line contact spacer 147 may include, for example, at least one of silicon nitride (SiN), silicon oxynitride (SiON), and silicon oxide (SiO$_2$). The first bit line contact spacer 147 is illustrated as a single layer, but it is only for convenience of explanation and the present disclosure is not limited thereto. In the following description, the first bit line contact spacer 147 will be described as including silicon nitride.

In some embodiments although not shown, the first bit line contact spacer 147 may not be disposed on the sidewall 146B_SW of the lower bit line contact. The first bit line contact spacer 147 may also be removed during fabrication of the bit line contact 146.

A second bit line contact spacer 148 is disposed on the lower bit line contact 146B. The second bit line contact spacer 148 extends along the sidewall 146U_SW of the upper bit line contact.

The second bit line contact spacer 148 covers a portion of the upper surface 146B_US of the lower bit line contact. The second bit line contact spacer 148 may be in contact with the upper surface 146B_US of the lower bit line contact.

The second bit line contact spacer 148 is disposed between the first bit line contact spacer 147 and the bit line contact 146. More specifically, the second bit line contact spacer 148 is disposed between the first bit line contact spacer 147 and the upper bit line contact 146U.

The second bit line contact spacer 148 may include a second lower bit line contact spacer 148A and a second upper bit line contact spacer 148B. The second upper bit line contact spacer 148B is disposed on the second lower bit line contact spacer 148A. The second lower bit line contact spacer 148A is disposed between the second upper bit line contact spacer 148B and the first bit line contact spacer 147.

For example, the second lower bit line contact spacer 148A may include silicon oxide, and the second upper bit line contact spacer 148B may include silicon nitride, but the present disclosure is not limited thereto. In some embodiments although not shown, the second bit line contact spacer 148 may be a single layer or may include three or more layers.

A storage pad 160 may be disposed on each node connection pad 125. The storage pad 160 may be electrically connected to the node connection pad 125. The storage pad 160 may be connected to the storage connection portion 103b of the cell active area ACT. Here, the storage pad 160 may correspond to the landing pad LP.

In the semiconductor memory device according to some example embodiments, the storage pad 160 may extend to the node connection pad 125 to be connected to the node connection pad 125. The storage pad 160 may overlap a portion of the upper surface of the bit line structure 140ST.

The storage pad 160 may include, for example, at least one of a semiconductor material doped with impurities, a conductive silicide compound, conductive metal nitride, conductive metal carbide, a metal, and a metal alloy.

A pad isolation insulating layer 180 may be formed on the storage pad 160 and the bit line structure 140ST. For example, the pad isolation insulating layer 180 may be disposed on the cell line capping layer 144. The pad isolation insulating layer 180 may define the storage pad 160 forming a plurality of isolation areas.

The pad isolation insulating layer 180 does not cover an upper surface 160US of the storage pad. The pad isolation insulating layer 180 may fill a pad isolation recess. The pad isolation recess may isolate the storage pads 160 adjacent to each other. For example, the upper surface 160US of the storage pad may be on the same plane as an upper surface 180US of the pad isolation insulating layer.

The pad isolation insulating layer 180 may include an insulating material and may electrically isolate the plurality of storage pads 160 from each other. For example, the pad isolation insulating layer 180 may include, for example, at least one of a silicon oxide layer, a silicon nitride layer, a silicon oxynitride layer, a silicon oxycarbonitride layer, and a silicon carbonitride layer, but is not limited thereto.

An etching stop layer 165 may be disposed on the storage pad 160 and the pad isolation insulating layer 180. The etching stop layer 165 may include at least one of a silicon nitride layer, a silicon carbonitride layer, a silicon boron nitride layer (SiBN), a silicon oxynitride layer, and a silicon oxycarbide layer.

The information storage portion 190 may be disposed on the storage pad 160. The information storage portion 190 may be electrically connected to the storage pad 160. A portion of the information storage portion 190 may be disposed in the etching stop layer 165.

The information storage portion 190 may include, for example, a capacitor, but is not limited thereto. The information storage portion 190 includes a lower electrode 191, a capacitor dielectric layer 192, and an upper electrode 193.

For example, the upper electrode 193 may be a plate upper electrode having a plate shape.

The lower electrode 191 may be disposed on the storage pad 160. The lower electrode 191 is illustrated as having a pillar shape, but is not limited thereto. The lower electrode 191 may also have a cylindrical shape.

The capacitor dielectric layer 192 is formed on the lower electrode 191. The capacitor dielectric layer 192 may be formed along a profile of the lower electrode 191. The upper electrode 193 is formed on the capacitor dielectric layer 192. The upper electrode 193 may surround an outer sidewall of the lower electrode 191. The upper electrode 193 is illustrated as a single layer, but this is only for convenience of explanation and the present disclosure is not limited thereto.

Each of the lower electrode 191 and the upper electrode 193 may include, for example, a doped semiconductor material, conductive metal nitride (e.g., titanium nitride, tantalum nitride, niobium nitride, tungsten nitride, or the like), a metal (e.g., ruthenium, iridium, titanium, tantalum, or the like), conductive metal oxide (e.g., iridium oxide, niobium oxide, or the like), and the like, but is not limited thereto.

The capacitor dielectric layer 192 may include, for example, one of silicon oxide, silicon nitride, silicon oxynitride, a high-k material, and a combination thereof, but is not limited thereto. In the semiconductor memory device according to some example embodiments, the capacitor dielectric layer 192 may include a stacked layer structure in which zirconium oxide, aluminum oxide, and zirconium oxide are sequentially stacked. In the semiconductor memory device according to some example embodiments, the capacitor dielectric layer 192 may include a dielectric layer including hafnium (Hf). In the semiconductor memory device according to some example embodiments, the capacitor dielectric layer 192 may have a stacked layer structure of a ferroelectric material layer and a paraelectric material layer.

Figure 8:
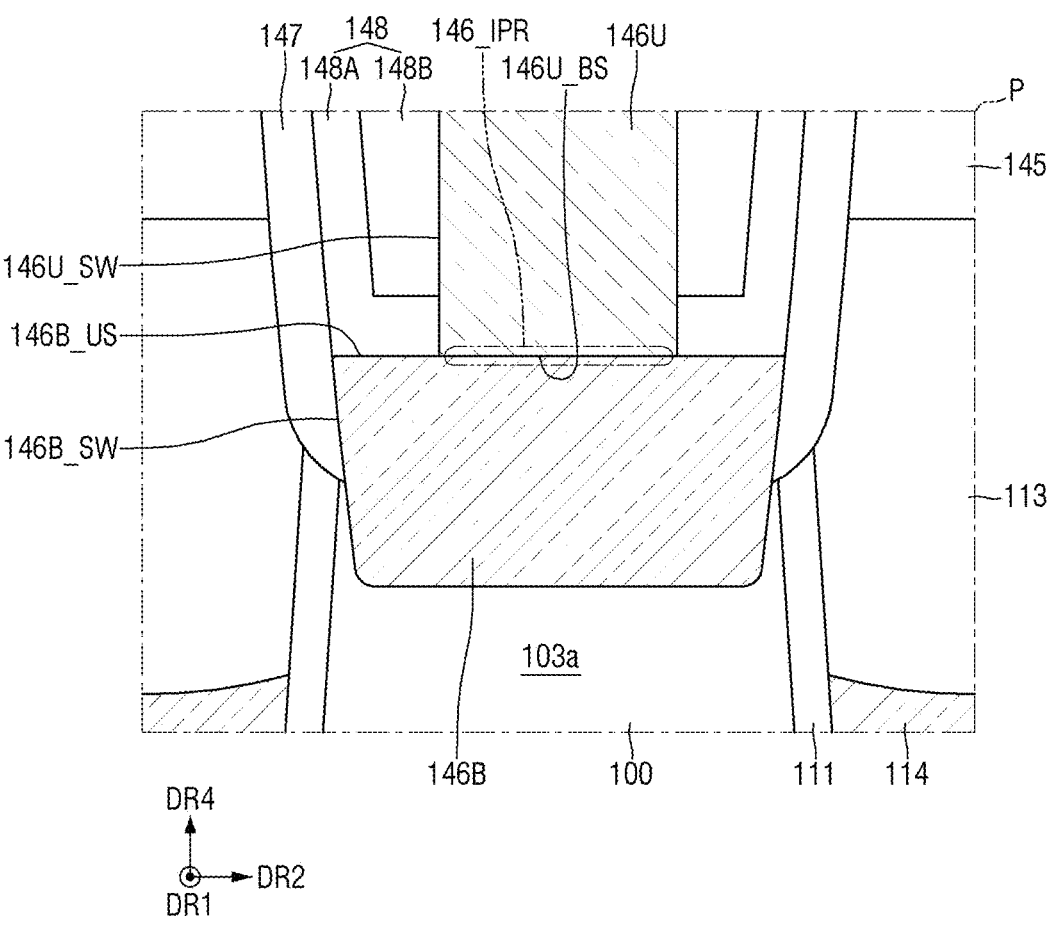
FIGS. 8 and 9 are views for describing a semiconductor device according to some example embodiments, respectively.
Figure 9:
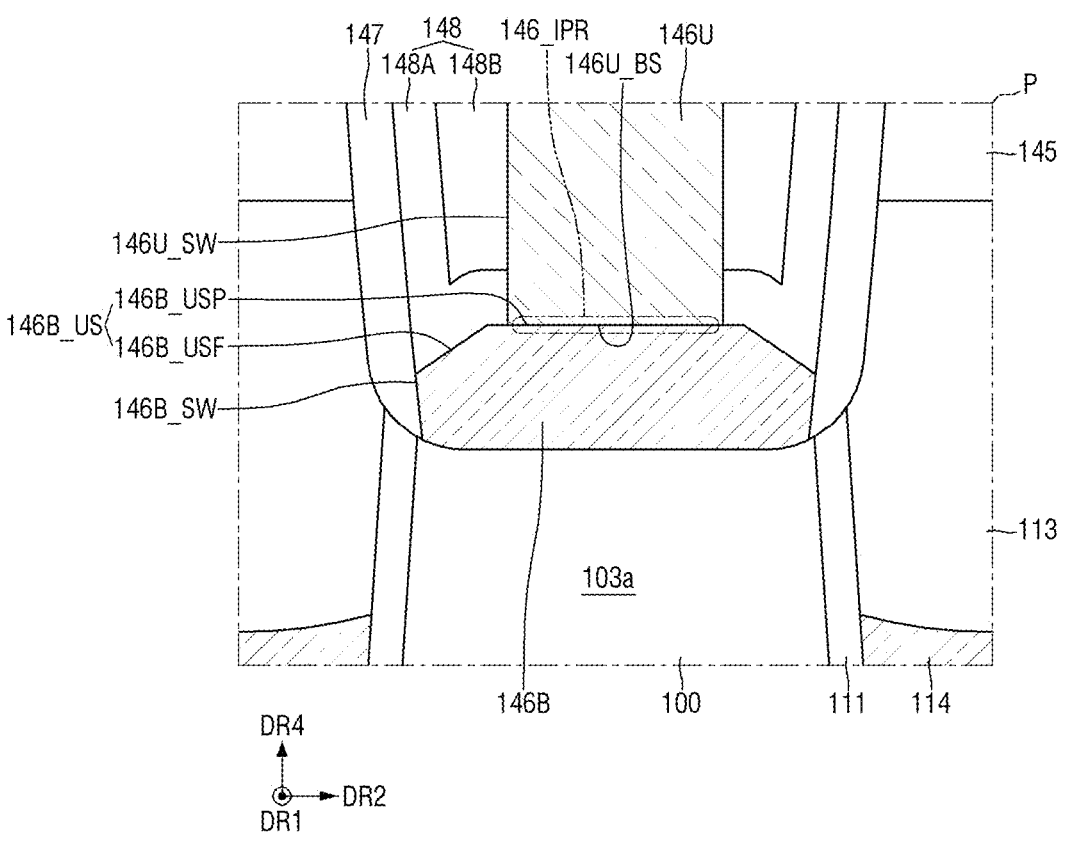
Figure 10:
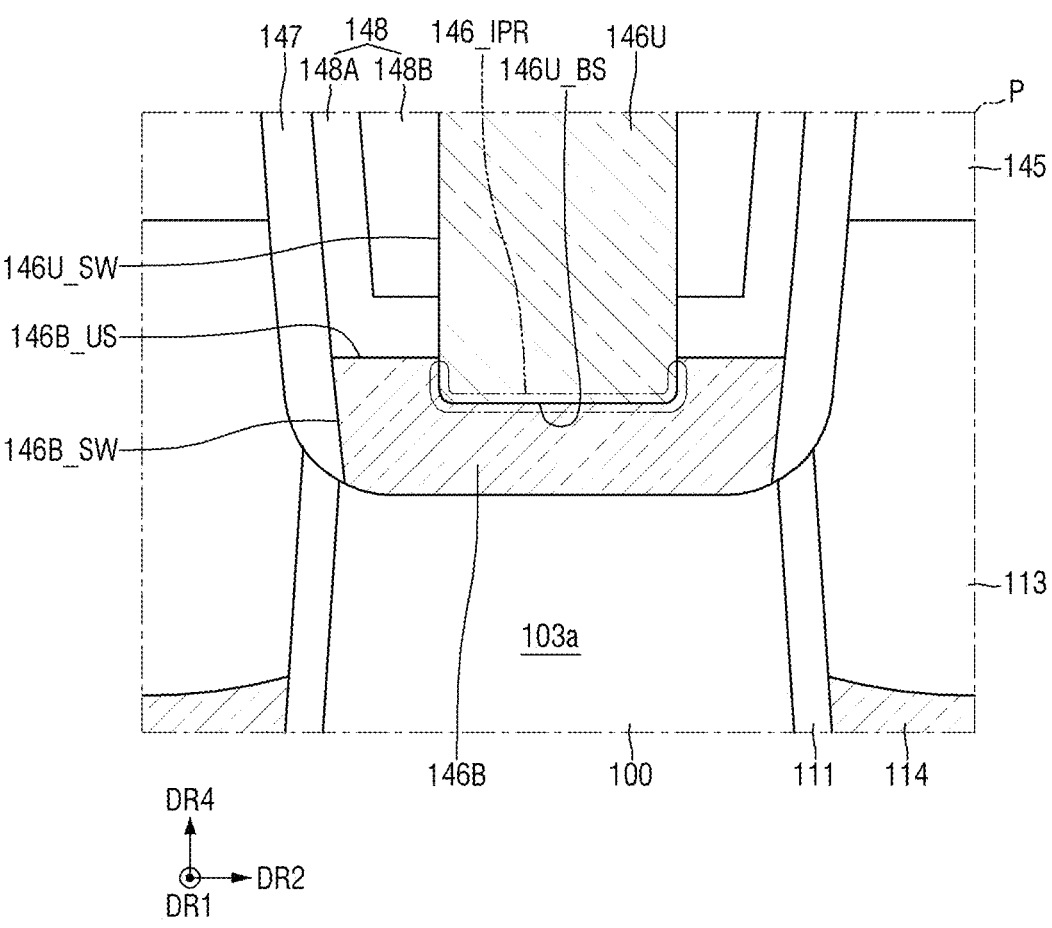
FIGS. 10 and 11 are views for describing a semiconductor device according to some example embodiments.
Figure 11:
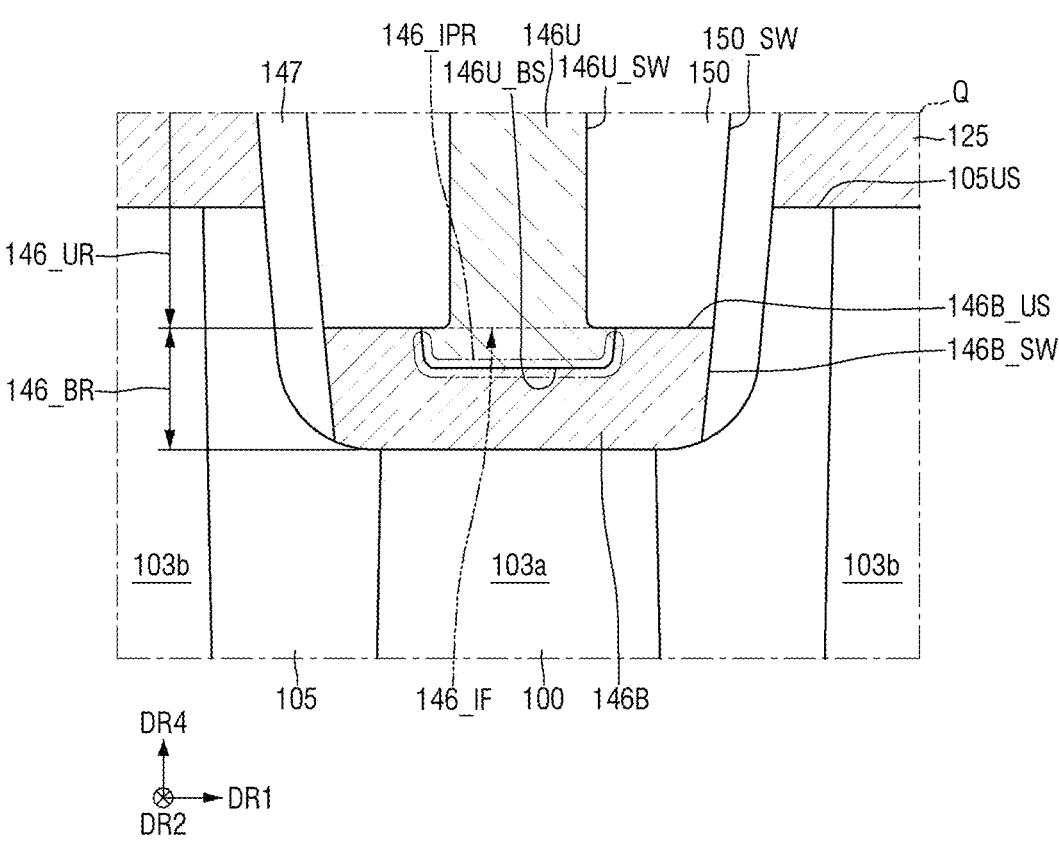

FIGS. 8 and 9 are views for describing a semiconductor device according to some example embodiments, respectively. FIGS. 10 and 11 are views for describing a semiconductor device according to some example embodiments. For convenience of explanation, points different from those described with reference to FIGS. 1 to 7 will be mainly described. For reference, FIGS. 8 to 10 are enlarged views of part P of FIG. 3, and FIG. 11 is an enlarged view of part Q of FIG. 4.

Referring to FIG. 8, in the semiconductor memory device according to some example embodiments, the first bit line contact spacer 147 covers a portion of the sidewall 146B_SW of the lower bit line contact.

A portion of the lower bit line contact 146B protrudes toward the substrate 100 compared to the lowermost portion of the first bit line contact spacer 147.

Referring to FIG. 9, in the semiconductor memory device according to some example embodiments, the upper surface 146B_US of the lower bit line contact may include a facet 146B_USF.

The facet 146B_USF of the upper surface 146B_US of the lower bit line contact extends from the first bit line contact spacer 147. The upper surface 146B_US of the lower bit line contact may include a planar area 146B_USP connected to the facet 146B_USF. In some embodiments although not shown, the upper surface 146B_US of the lower bit line contact may not include the planar area 146B_USP.

Referring to FIGS. 10 and 11, in the semiconductor memory device according to some example embodiments, the lower bit line contact 146B may cover a portion of the sidewall 146U_SW of the upper bit line contact.

A portion of the upper bit line contact 146U may be recessed into the lower bit line contact 146B. The upper surface 146B_US of the lower bit line contact may be higher than the lower surface 146U_BS of the upper bit line contact.

The impurity pile-up area 146_IPR may be formed along the sidewall 146U_SW of the upper bit line contact and the lower surface 146U_BS of the upper bit line contact that are recessed into the lower bit line contact 146B.

In FIG. 11, the lower contact area 146_BR may include the lower bit line contact 146B and the upper bit line contact 146U recessed into the lower bit line contact 146B.

At the boundary area 146_IF of the bit line contact, a width of the upper bit line contact 146U in the first direction DR1 is smaller than a width of the lower surface 146U_BS of the upper bit line contact in the first direction DR1.

Figure 12:
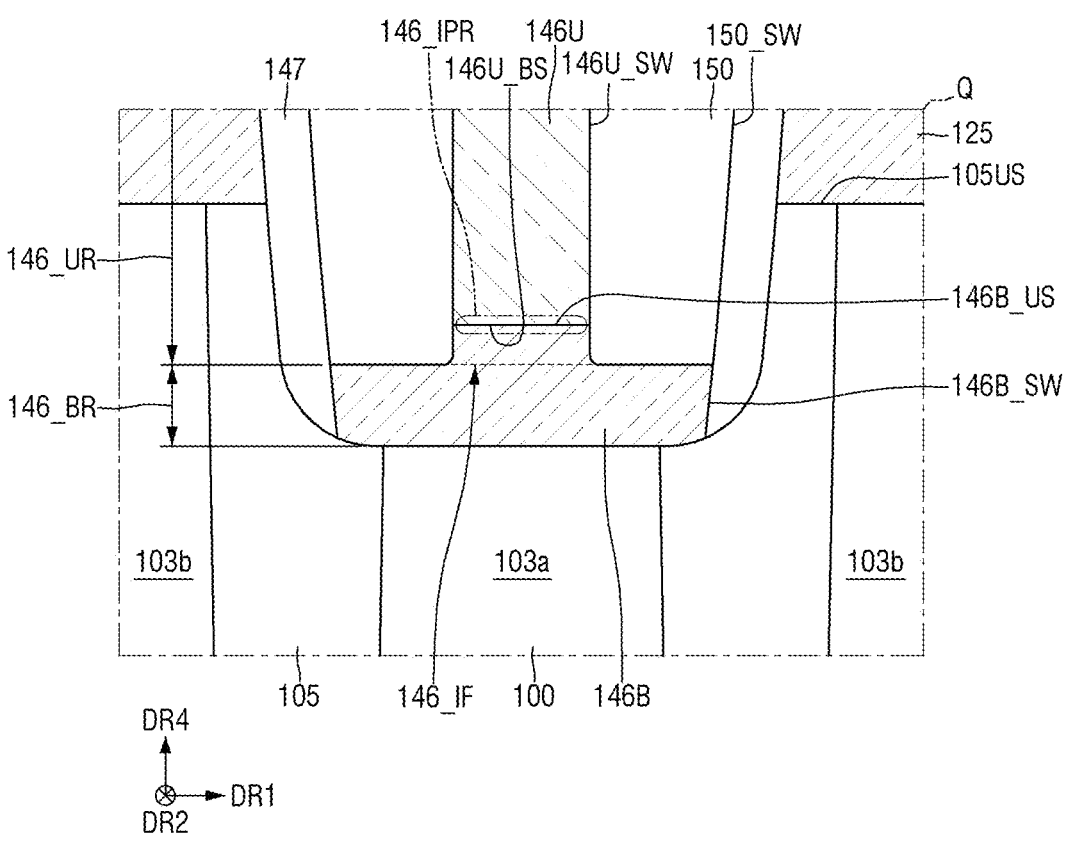
FIGS. 12 to 14 are views for describing a semiconductor device according to some example embodiments, respectively.
Figure 13:
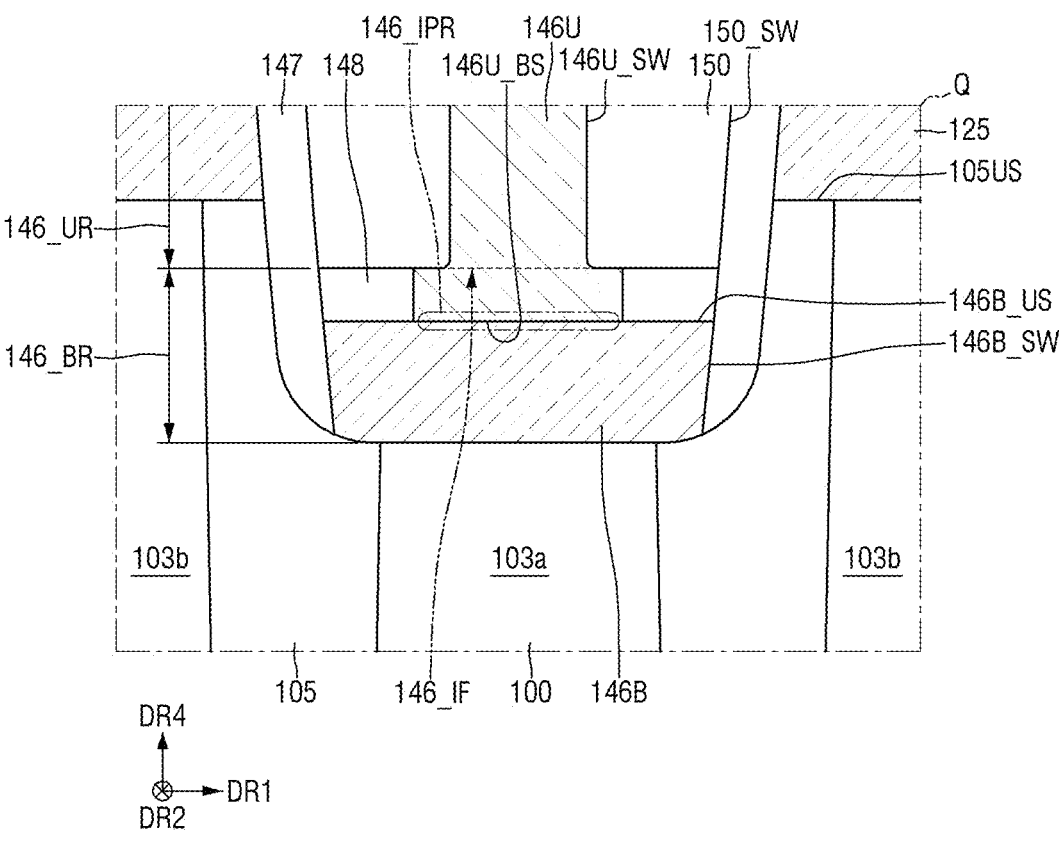
Figure 14:
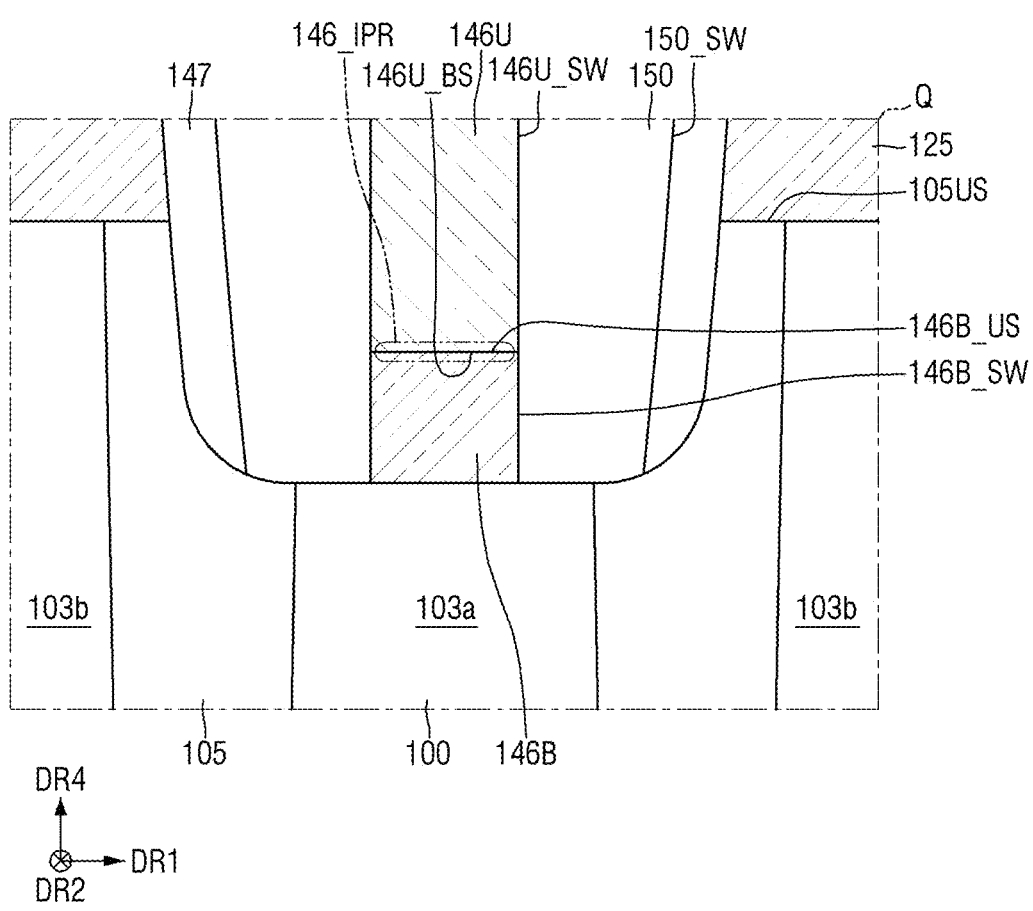

FIGS. 12 to 14 are views for describing a semiconductor device according to some example embodiments, respectively. For convenience of explanation, points different from those described with reference to FIGS. 1 to 7 will be mainly described.

For reference, FIGS. 12 to 14 are enlarged views of part Q of FIG. 4. Even if part Q of FIG. 4 is changed as illustrated in FIGS. 12 to 14, an enlarged view of part P of FIG. 3 may be the same as FIG. 5.

Referring to FIG. 12, in the semiconductor memory device according to some example embodiments, the upper contact area 146_UR may include a portion of the lower bit line contact 146B and the upper bit line contact 146U.

The upper surface 146B_US of the lower bit line contact is included in the upper contact area 146_UR. The lower contact area 146_BR includes the remainder of the lower bit line contact 146B.

Referring to FIG. 13, in the semiconductor memory device according to some example embodiments, the lower contact area 146_BR may include a portion of the upper bit line contact 146U and the lower bit line contact 146B.

The lower surface 146U_BS of the upper bit line contact is included in the lower contact area 146_BR. The upper contact area 146_UR includes the remainder of the upper bit line contact 146U.

The second bit line contact spacer 148 may be disposed between the bit line spacer 150 and the lower bit line contact 146B.

Referring to FIG. 14, in the semiconductor memory device according to some example embodiments, the bit line contact 146 does not include the lower contact area (146_BR in FIG. 6).

The bit line spacer 150 extends up to the bit line connection portion 103a.

Figure 15:
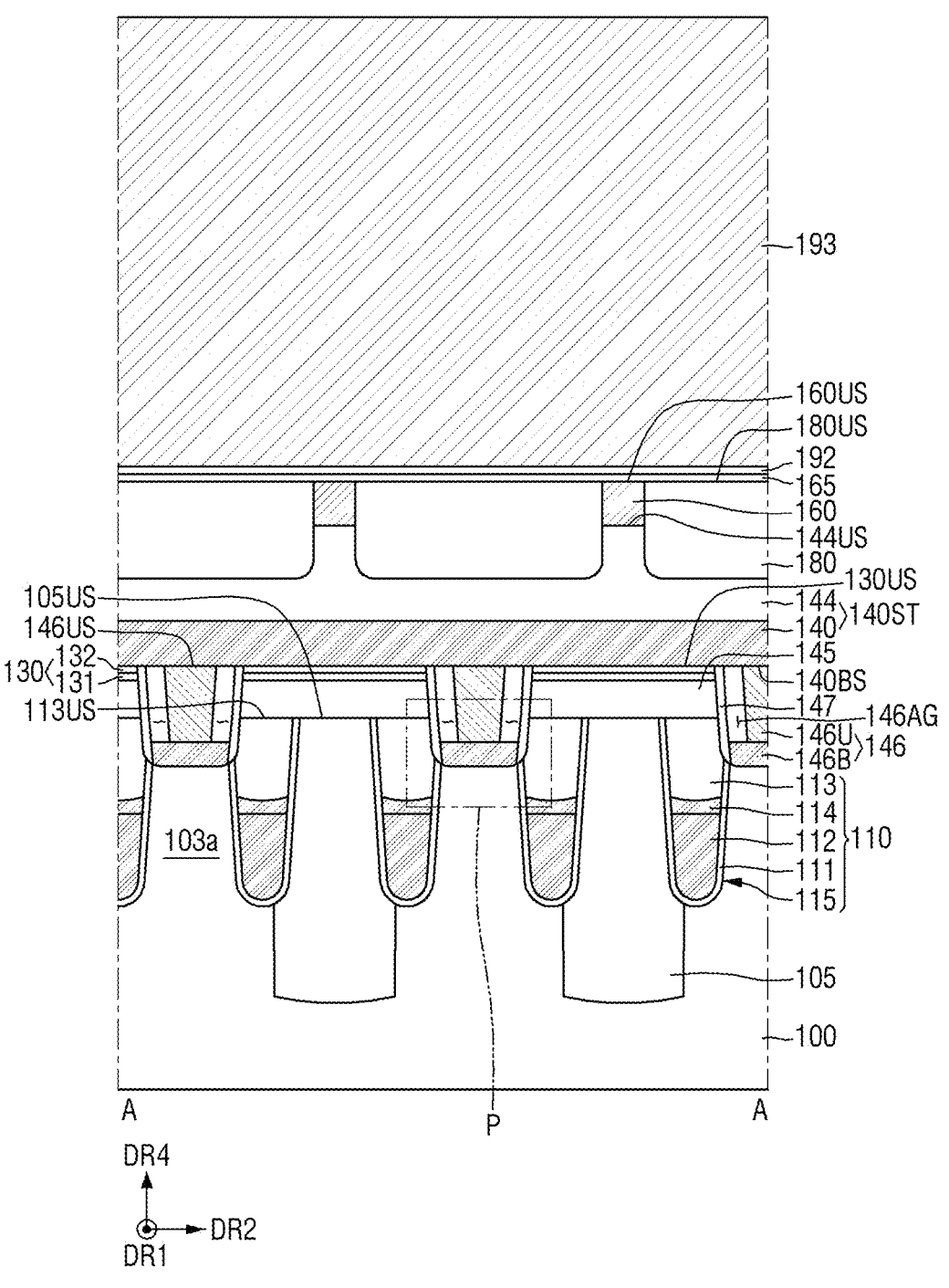
FIGS. 15 to 17 are views for describing a semiconductor memory device according to some example embodiments.
Figure 16:
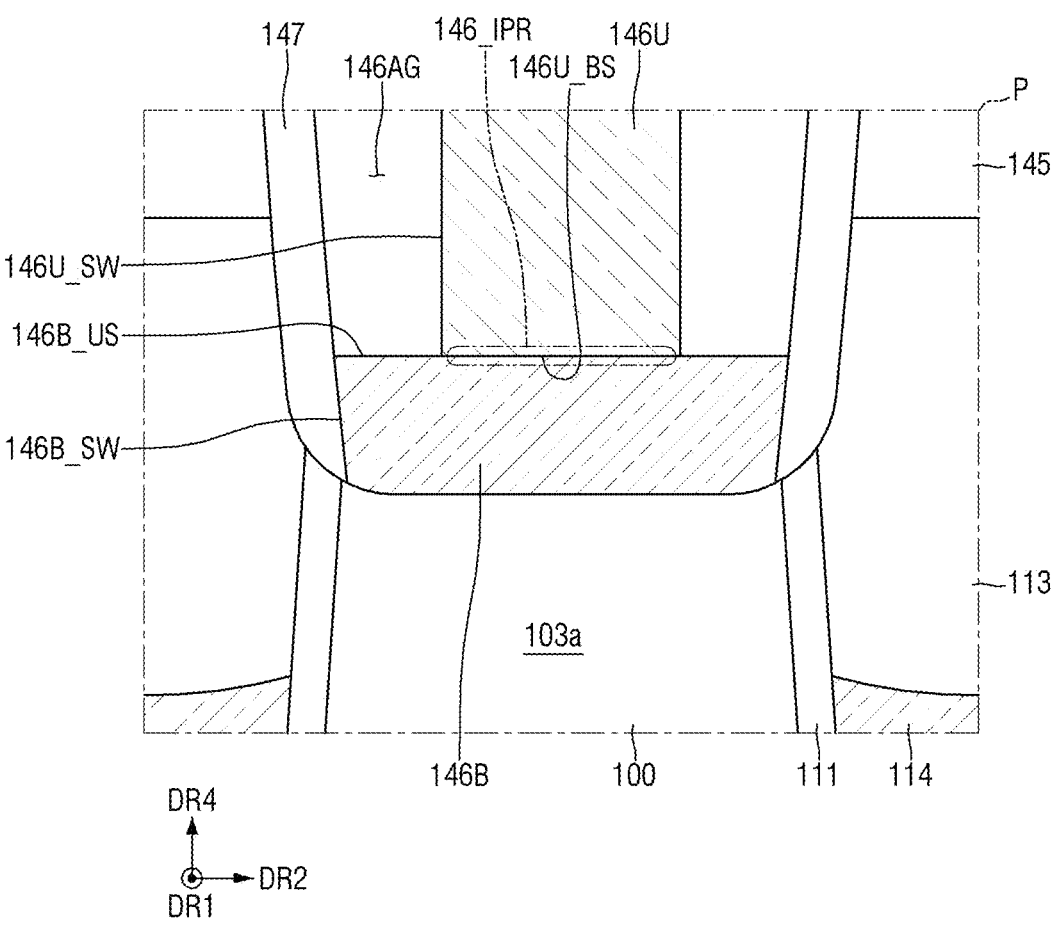
Figure 17:
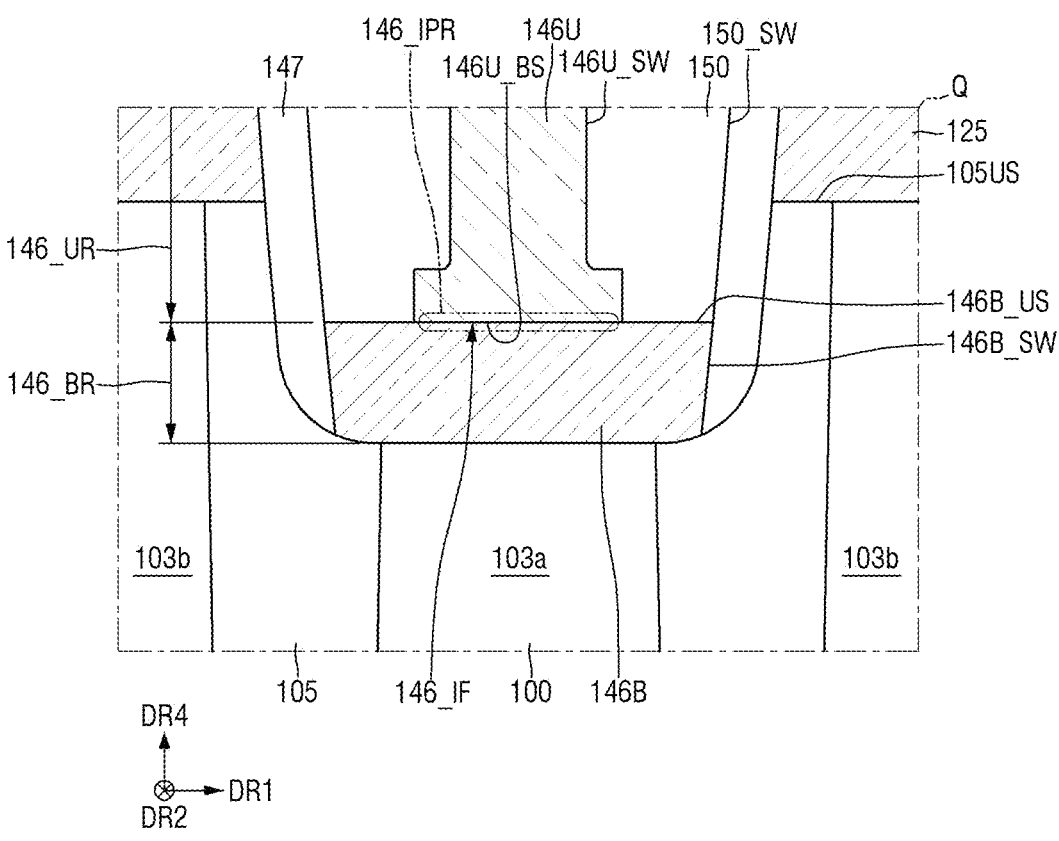

FIGS. 15 to 17 are views for describing a semiconductor memory device according to some example embodiments. For convenience of explanation, points different from those described with reference to FIGS. 1 to 7 will be mainly described.

For reference, FIG. 16 is an enlarged view of part P of FIG. 15. As an example, even if part Q of FIG. 15 is changed as illustrated in FIG. 16, an enlarged view of part Q of FIG. 4 may be the same as FIGS. 6, 12, and 14. As another example, when part Q of FIG. 15 is changed as illustrated in FIG. 16, an enlarged view of part Q of FIG. 4 may be the same as FIG. 17 instead of FIG. 13.

Referring to FIGS. 15 to 17, in the semiconductor memory device according to some example embodiments, a bit line contact air gap 146AG may be disposed between the lower bit line contact 146B and the cell conductive line 140.

During fabrication of the bit line contact 146, the second bit line contact spacer (148 in FIG. 3) may be removed. In this case, the bit line contact air gap 146AG may be seen in a cross-sectional view as illustrated in FIG. 15.

The upper contact area 146_UR may include the upper bit line contact 146U and may not include the lower bit line contact 146B. The upper bit line contact 146U included in the upper contact area 146_UR may include a first portion and a second portion having different widths. The first portion of the upper bit line contact 146U may be disposed between the second portion of the upper bit line contact 146U and the lower bit line contact 146B.

Figure 18:
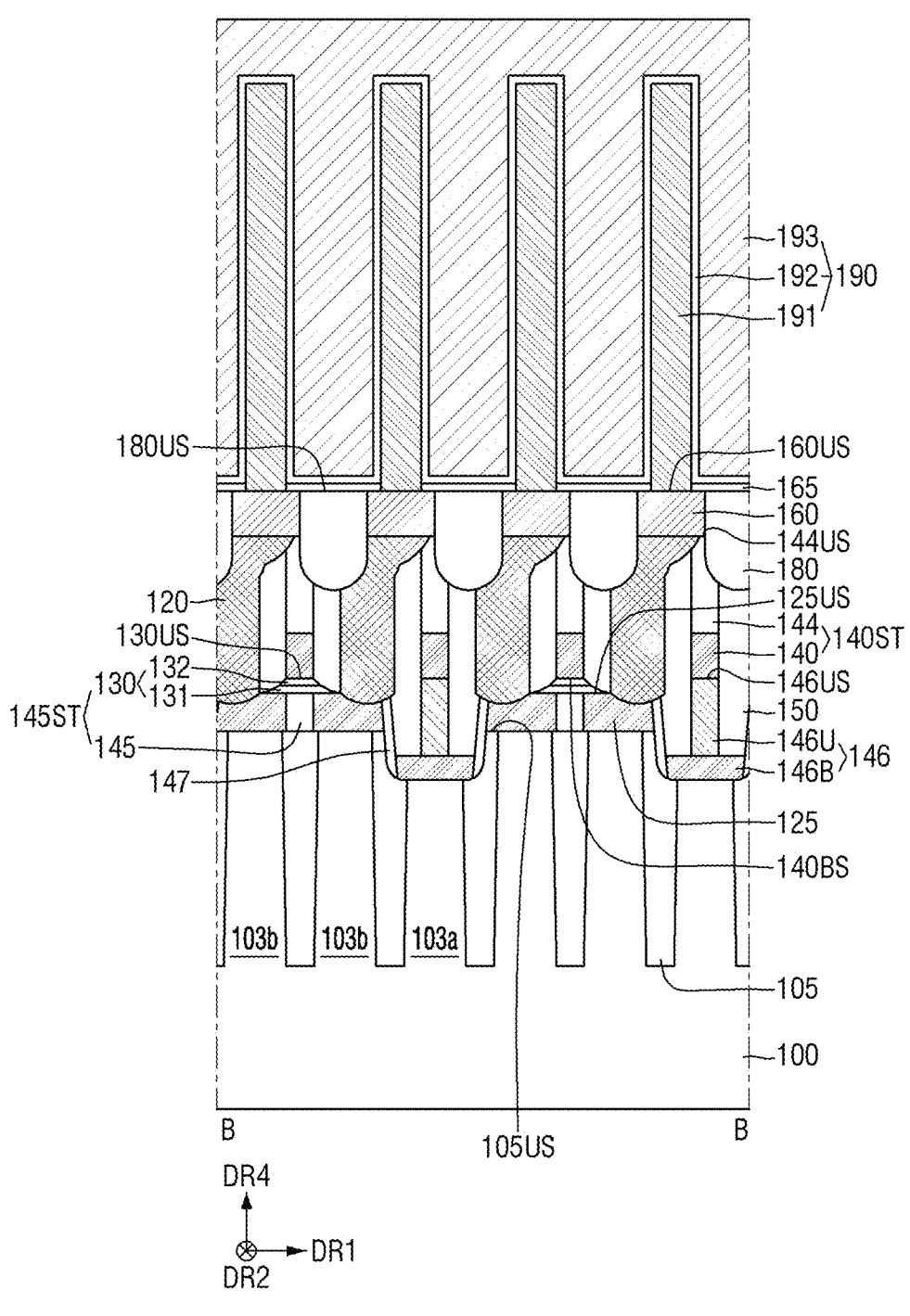
FIGS. 18 and 19 are views for describing a semiconductor device according to some example embodiments, respectively.
Figure 19:
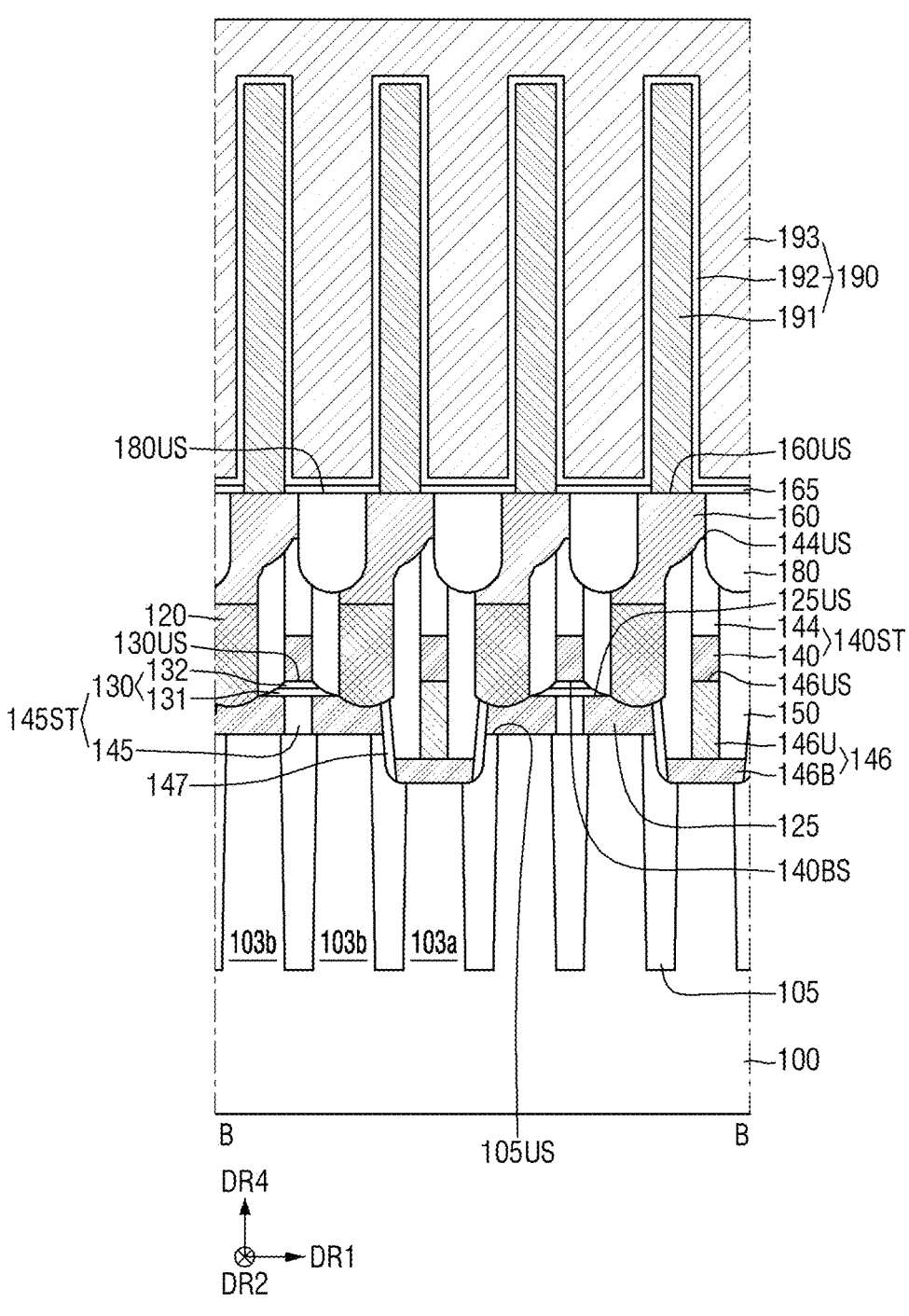

FIGS. 18 and 19 are views for describing a semiconductor device according to some example embodiments, respectively. For convenience of explanation, points different from those described with reference to FIGS. 1 to 7 will be mainly described.

Referring to FIGS. 18 and 19, the semiconductor memory device according to some example embodiments may further include a storage contact 120 disposed between the node connection pad 125 and the storage pad 160.

The storage contact 120 connects the node connection pad 125 and the storage pad 160 to each other. The storage contact 120 may include, for example, at least one of a semiconductor material doped with impurities, a conductive silicide compound, conductive metal nitride, a metal, and a metal alloy.

In FIG. 18, an upper surface of the storage contact 120 may be on the same level as an upper surface 144US of the cell line capping layer.

In FIG. 19, the upper surface of the storage contact 120 is lower than the upper surface 144US of the cell line capping layer.

Figure 20:
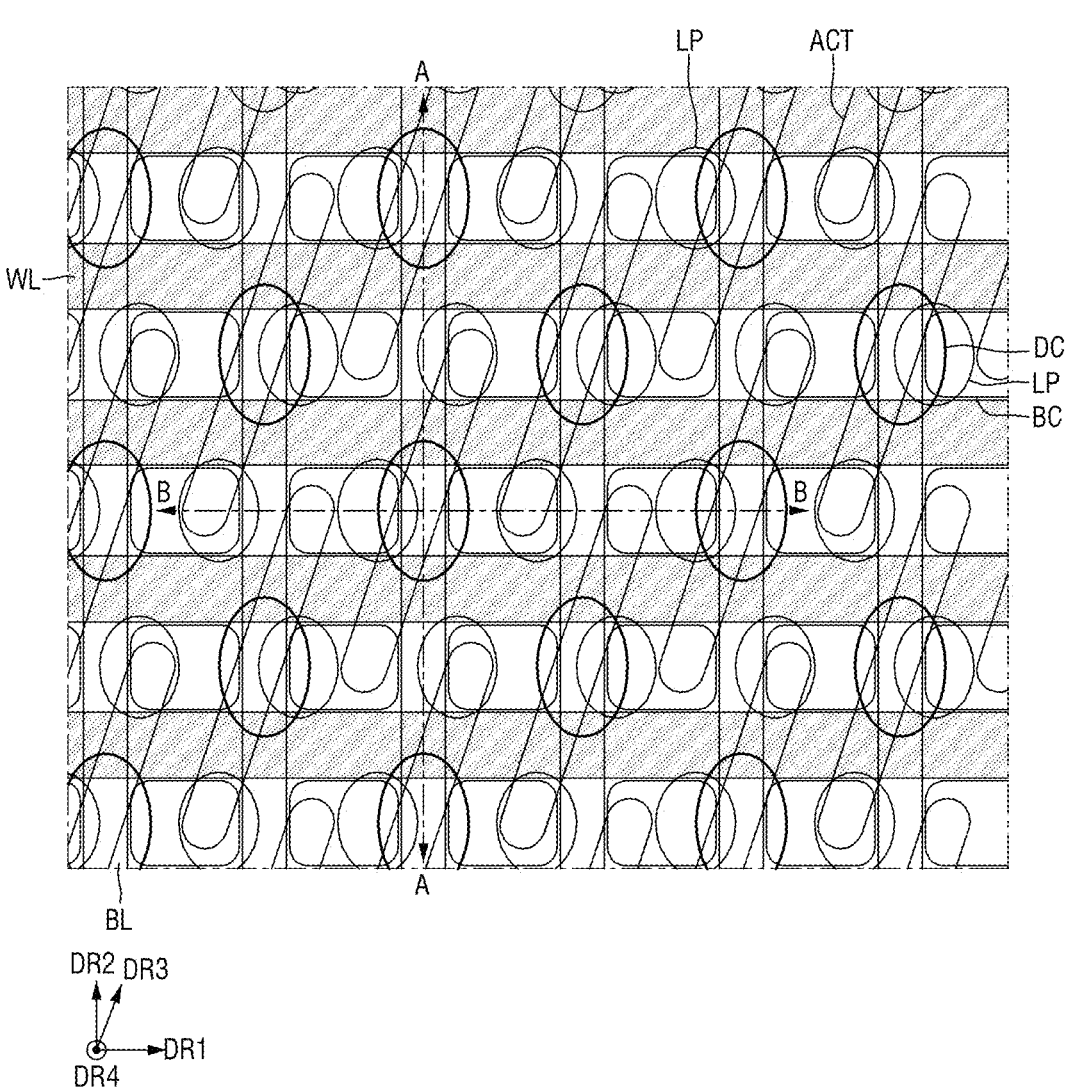
FIGS. 20 to 22 are views for describing a semiconductor memory device according to some example embodiments.
Figure 21:
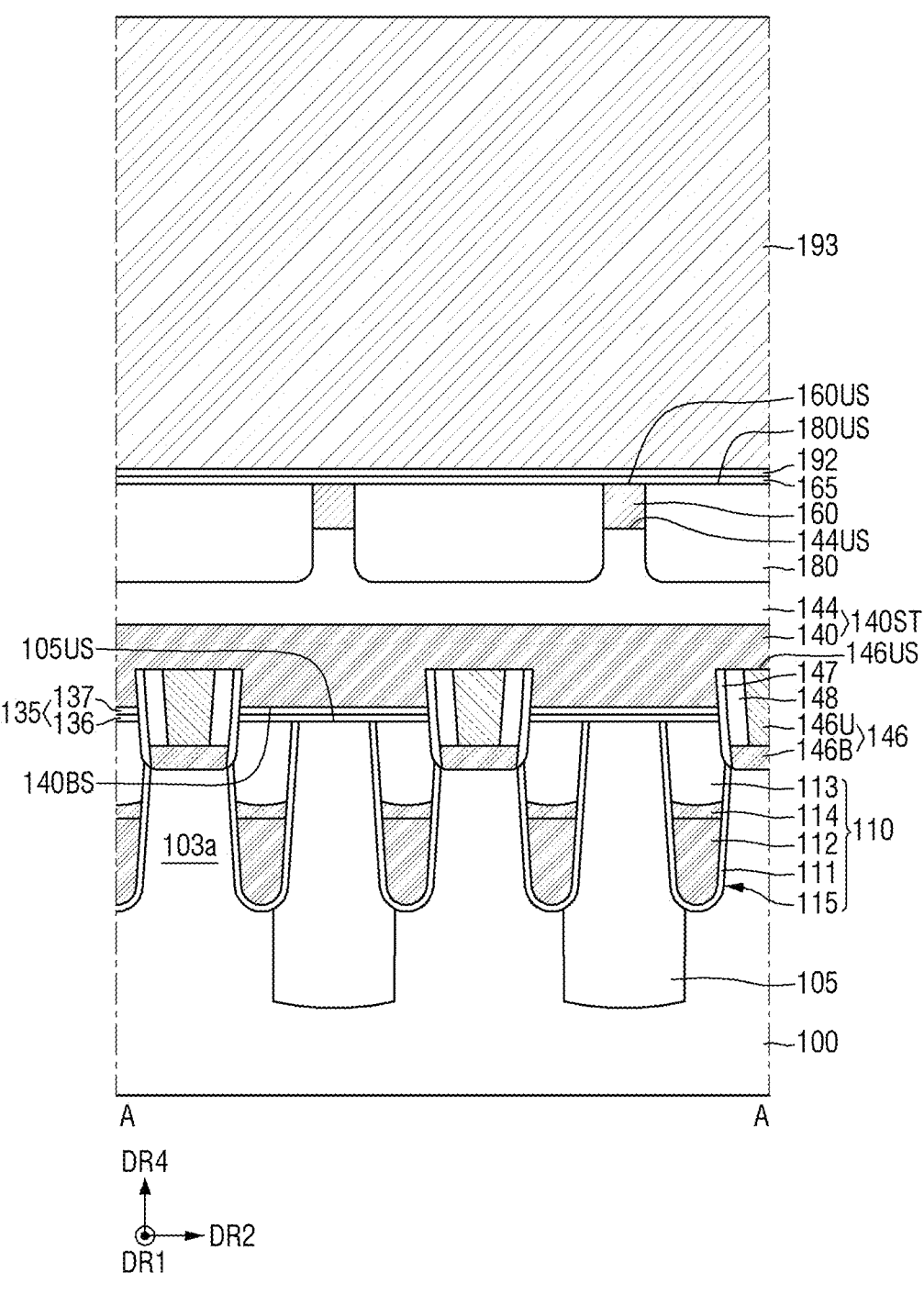
Figure 22:
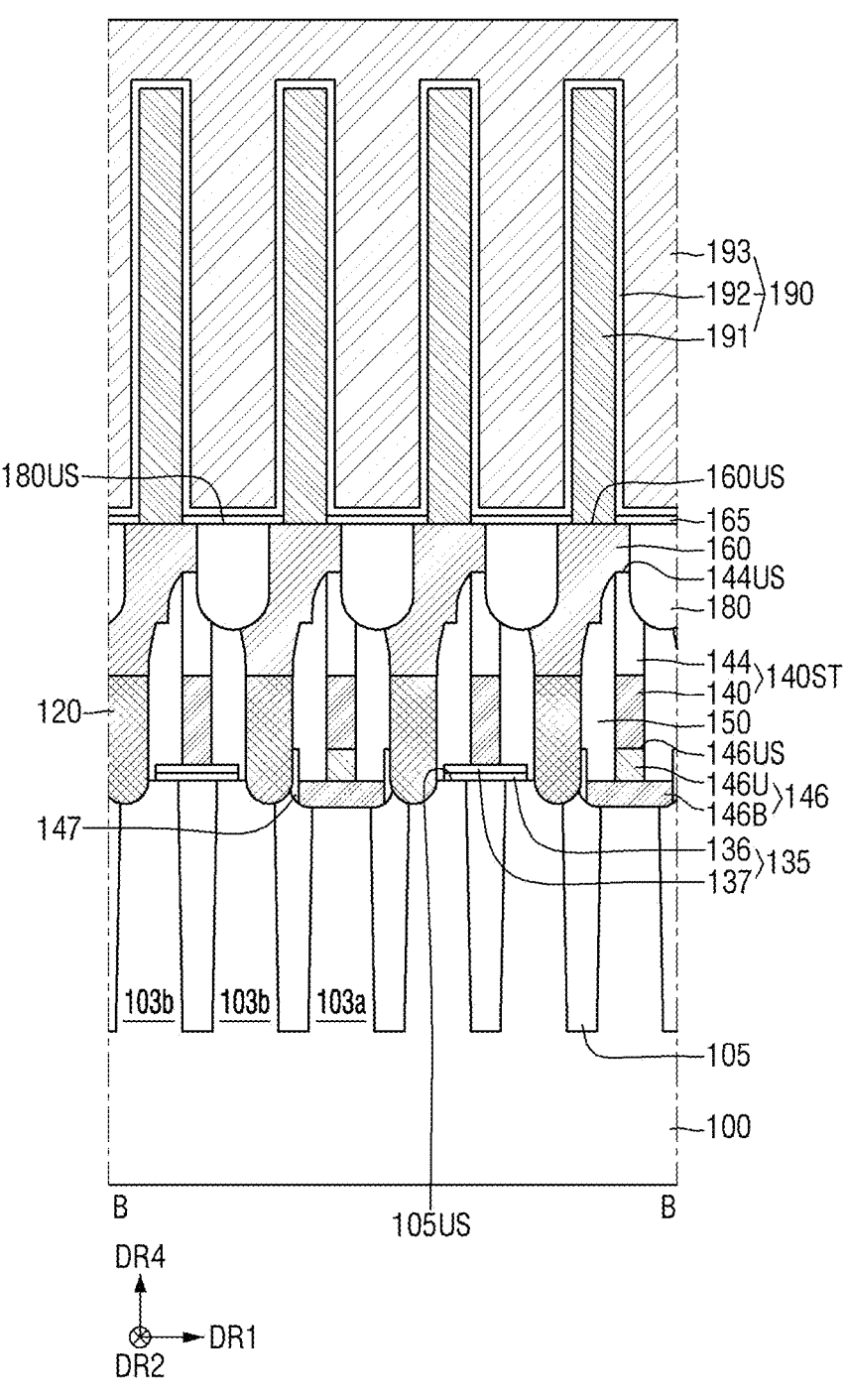

FIGS. 20 to 22 are views for describing a semiconductor memory device according to some example embodiments. For convenience of explanation, points different from those described with reference to FIGS. 1 to 7 will be mainly described.

For reference, FIG. 20 is a schematic layout of a semiconductor memory device according to some example embodiments. FIGS. 21 and 22 are cross-sectional views taken along lines A-A and B-B of FIG. 20.

Referring to FIGS. 20 to 22, the semiconductor memory device according to some example embodiments includes the buried contact BC connecting the cell active area ACT to the lower electrode 191 of the capacitor, but does not include the node pad (XP in FIG. 1).

The landing pad LP may be disposed between the buried contact BC and the lower electrode 191 of the capacitor.

A lower cell insulating layer 135 may be formed on the substrate 100 and the cell element isolation layer 105. More specifically, the lower cell insulating layer 135 may be disposed on the substrate 100 and the cell element isolation layer 105 in which the bit line contact 146 is not formed. The lower cell insulating layer 135 may be disposed between the substrate 100 and the cell conductive line 140 and between the cell element isolation layer 105 and the cell conductive line 140.

The lower cell insulating layer 135 may be a single layer, but as illustrated, the lower cell insulating layer 135 may be a multilayer including a first lower cell insulating layer 136 and a second lower cell insulating layer 137. For example, the first lower cell insulating layer 136 may include a silicon oxide layer, and the second lower cell insulating layer 137 may include a silicon nitride layer, but is not limited thereto.

In some embodiments although not shown, the lower cell insulating layer 135 may also include three or more insulating layers.

A portion of the bit line contact 146 may be recessed into the cell conductive line 140. For example, a portion of the upper bit line contact 146U may be recessed into the cell conductive line 140. Based on the upper surface 105US of the cell element isolation layer, the upper surface 146US of the bit line contact is higher than the lower surface 140BS of the cell conductive line.

The upper surface 146US of the bit line contact may protrude to be higher than an upper surface of the lower cell insulating layer 135. Based on the upper surface 105US of the cell element isolation layer, a height of the upper surface 146US of the bit line contact is higher than a height of the upper surface of the lower cell insulating layer 135.

A portion of the first bit line contact spacer 147 and a portion of the second bit line contact spacer 148 are disposed between the bit line contact 146 and the cell conductive line 140.

A plurality of storage contacts 120 may be disposed between the cell conductive lines 140 adjacent to each other in the first direction DR1. The storage contact 120 may overlap the substrate 100 and the cell element isolation layer 105 between the cell conductive lines 140 adjacent to each other. The storage contact 120 may be connected to the storage connection portion (103b in FIG. 2) of the cell active area ACT. Here, the storage contact 120 may correspond to the buried contact BC.

The plurality of storage contacts 120 may include, for example, at least one of a semiconductor material doped with impurities, a conductive silicide compound, conductive metal nitride, a metal, and a metal alloy.

The storage pad 160 may be formed on the storage contact 120. The storage pad 160 may be electrically connected to the storage contact 120.

FIGS. 23 to 39 are intermediate step views for describing a method for fabricating a semiconductor memory device according to some example embodiments. Among the descriptions of the fabricating method, the contents overlapping with those described with reference to FIGS. 1 to 22 will be briefly described or omitted.

Figure 24:
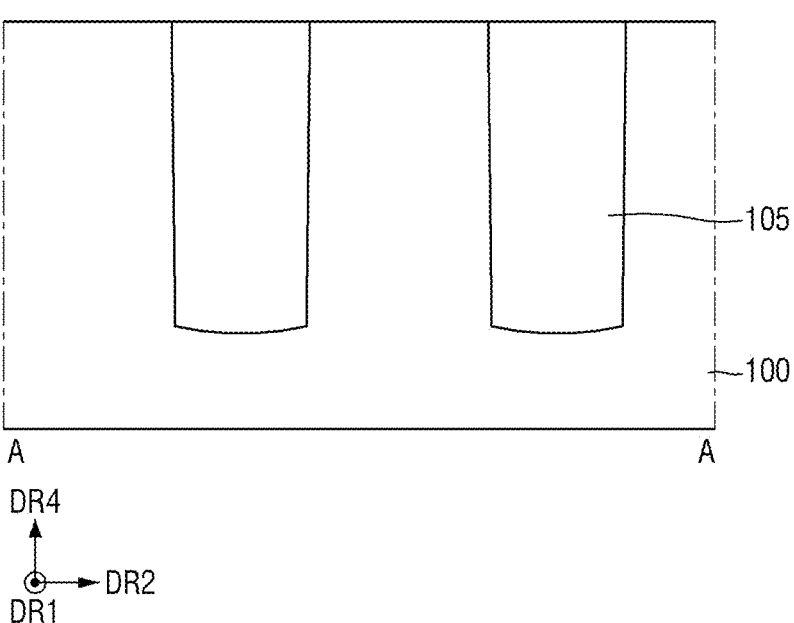
Figure 25:
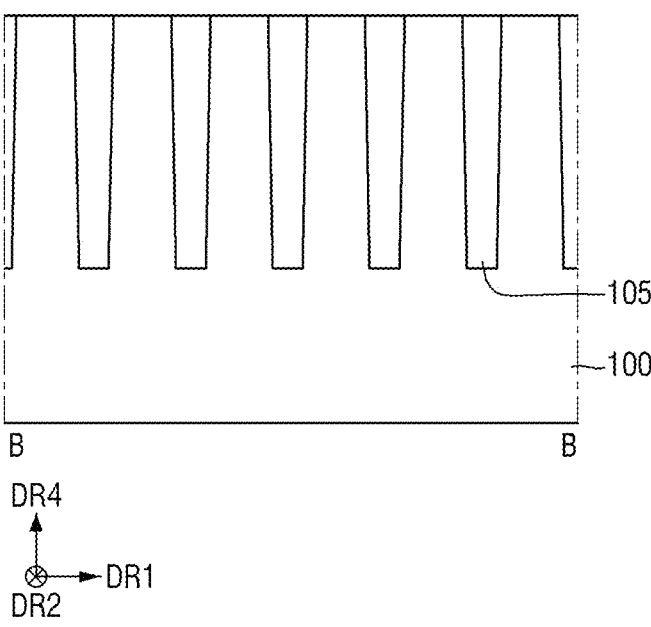

For reference, FIGS. 24 and 25 are cross-sectional views taken along lines A-A and B-B of FIG. 21, respectively.

Figure 23:
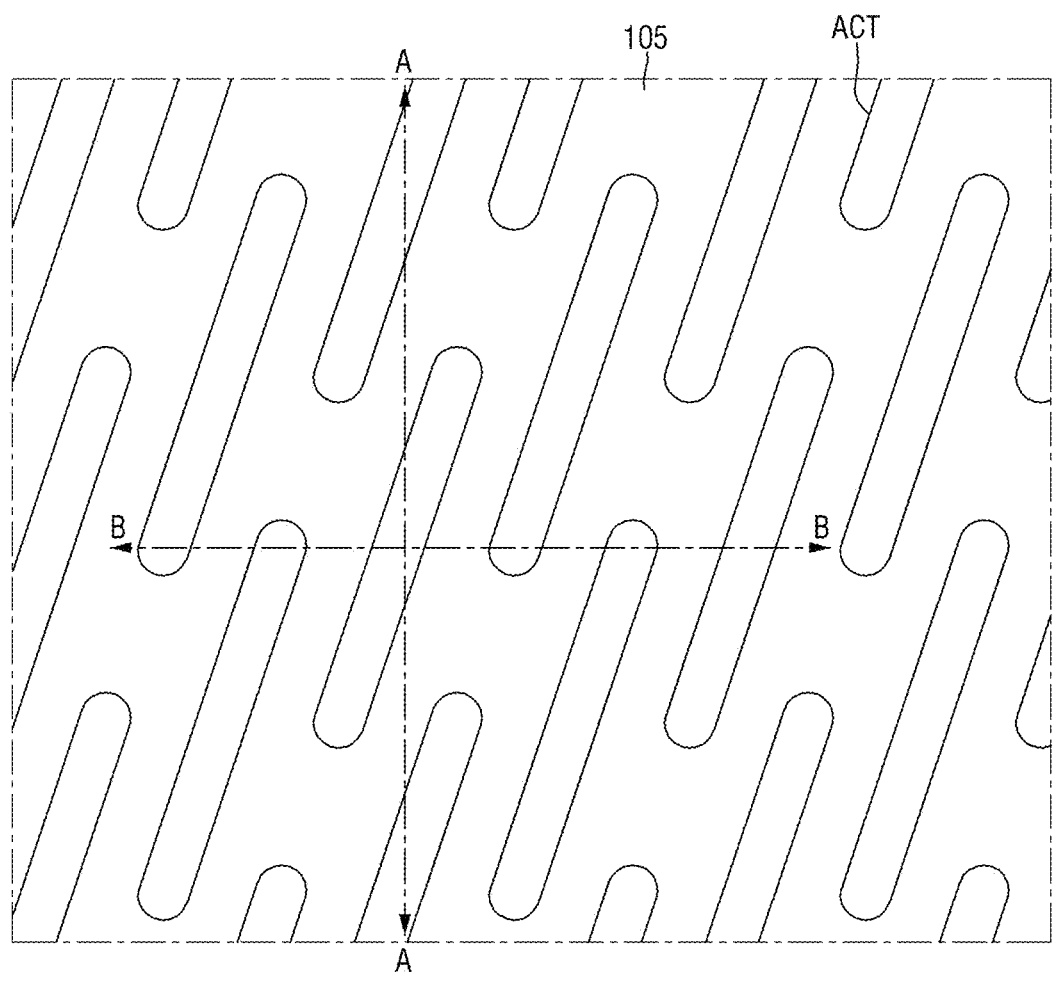
FIGS. 23 to 39 are intermediate step views for describing a method for fabricating a semiconductor memory device according to some example embodiments.
Figure 23:
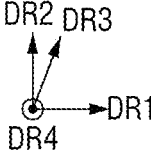

Referring to FIGS. 23 to 25, the cell element isolation layer 105 may be formed in a substrate 100.

The substrate 100 may include the cell active area ACT defined by the cell element isolation layer 105. The cell active area ACT may have a bar shape extending in the third direction DR3.

Figure 26:
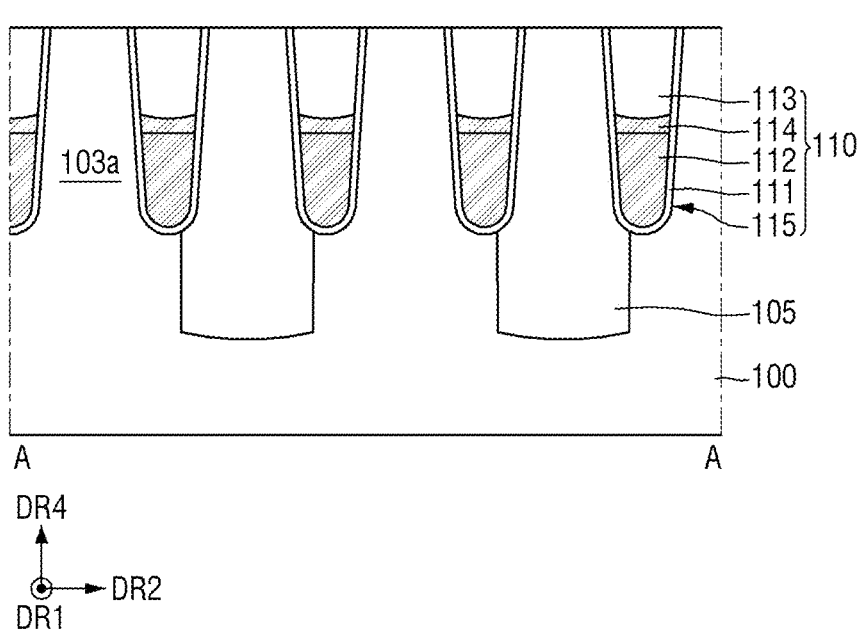
Figure 27:
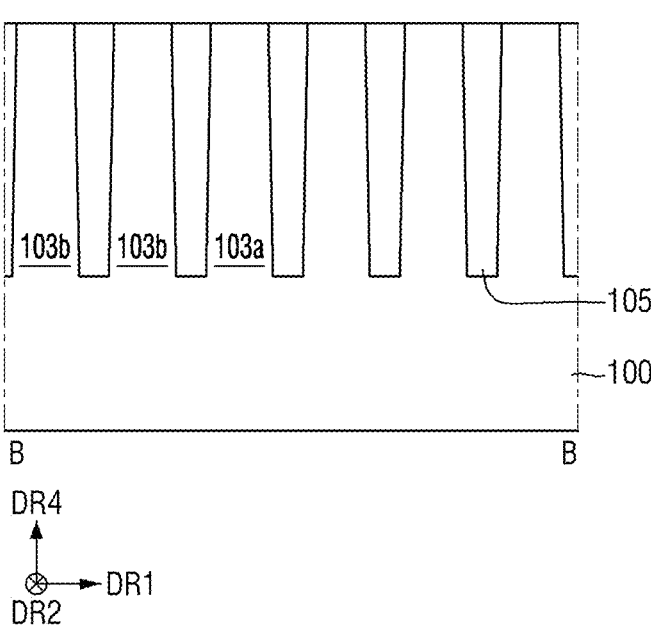

Referring to FIGS. 26 and 27, the cell gate electrode 112 is formed in the substrate 100 and the cell element isolation layer 105.

The cell gate electrode 112 may extend to be long in the first direction DR1. The cell gate electrodes 112 may be spaced apart from each other in the second direction DR2.

More specifically, the cell gate structure 110 extending in the first direction DR1 is formed in the substrate 100 and the cell element isolation layer 105. The cell gate structure 110 may include a cell gate trench 115, a cell gate insulating layer 111, a cell gate electrode 112, a cell gate capping pattern 113, and a cell gate capping conductive layer 114.

The cell gate electrode 112 intersects the cell active area (ACT in FIG. 23). By the cell gate electrode 112, the cell active area ACT may be divided into a bit line connection portion 103a and a storage connection portion 103b.

The cell active area ACT includes a bit line connection portion 103a positioned at a central portion of the cell active area ACT and a storage connection portion 103b positioned at an end portion of the cell active area ACT.

Figure 28:
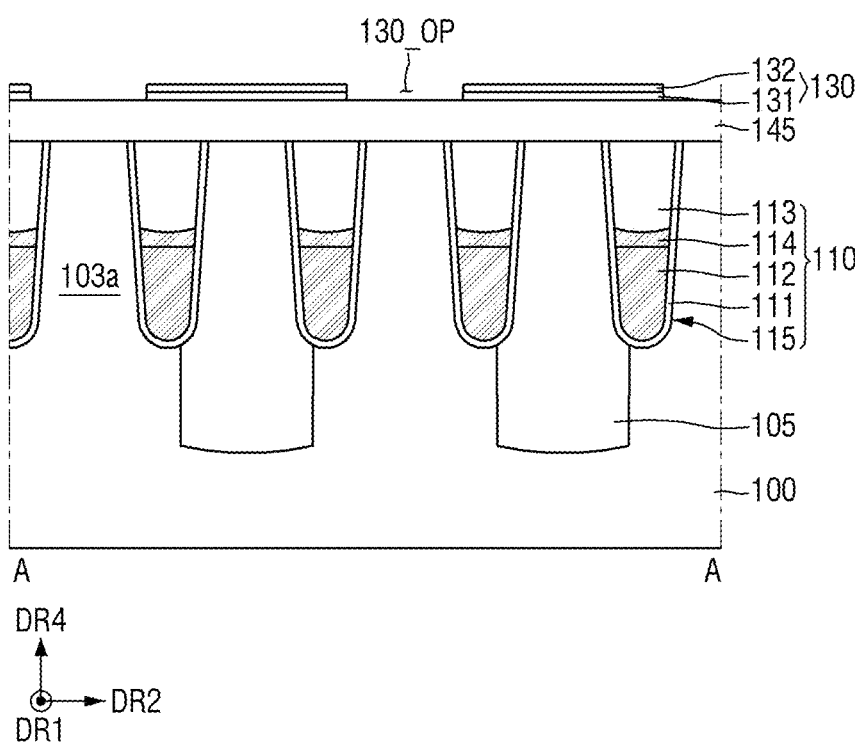
Figure 29:
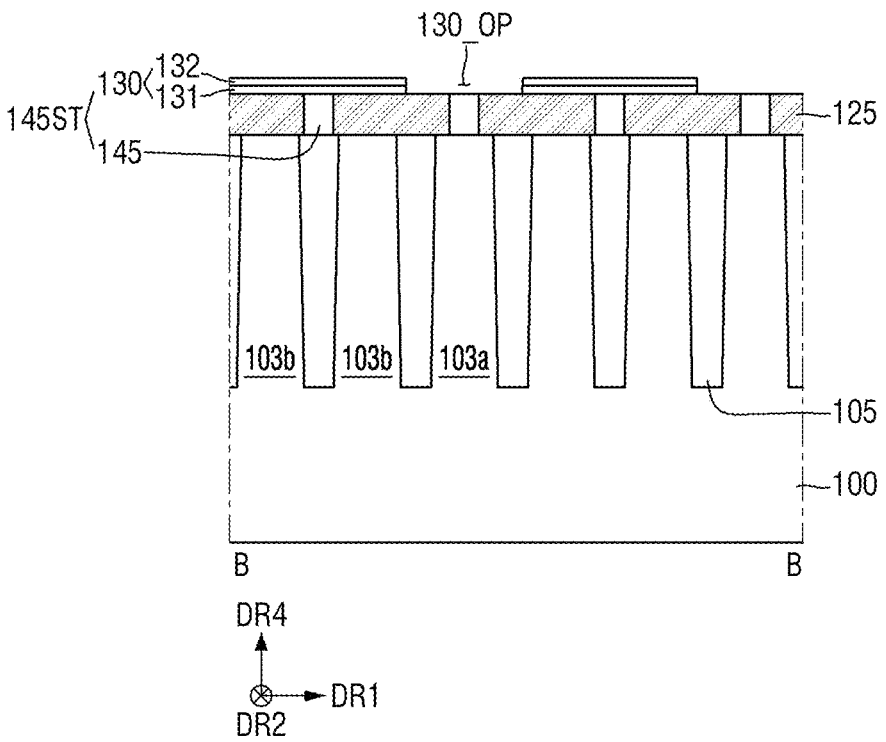

Referring to FIGS. 28 and 29, a node connection pad 125 and a pad isolation pattern 145 may be formed on the substrate 100.

The node connection pad 125 is connected to the storage connection portion 103b. The node connection pad 125 may be isolated by the pad isolation pattern 145 extending in the first direction DR1 and the second direction DR2. In plan view, the pad isolation pattern 145 may have a grid shape.

An upper cell insulating layer 130 is formed on the pad isolation pattern 145. The upper cell insulating layer 130 includes a bit line contact opening 130_OP. The bit line contact opening 130_OP overlaps the bit line connection portion 103a in the fourth direction DR4.

A pad isolation structure 145ST including the pad isolation pattern 145 and the upper cell insulating layer 130 is formed on the substrate 100.

Figure 30:
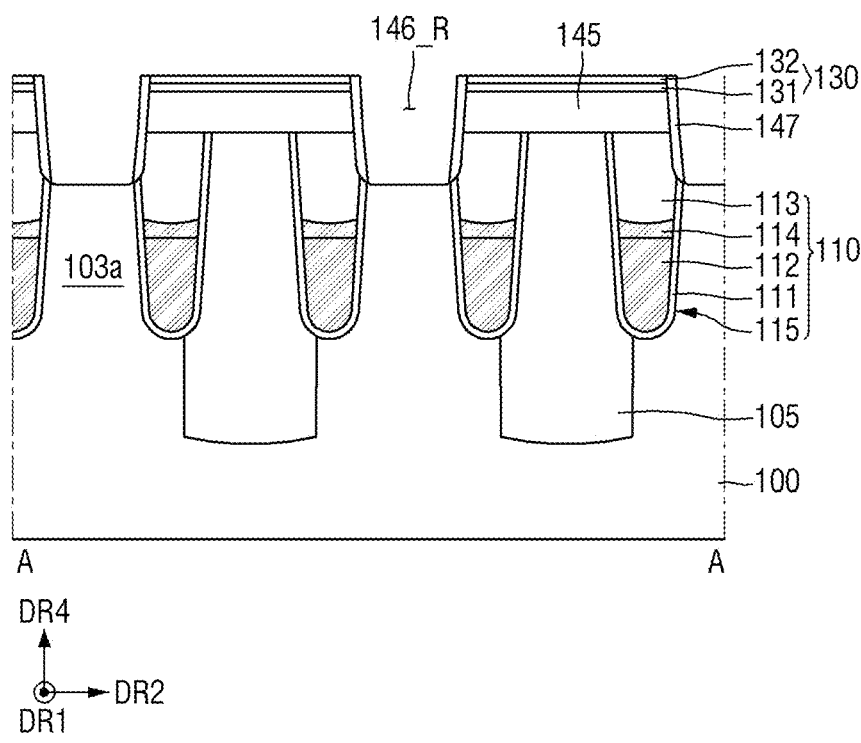
Figure 31:
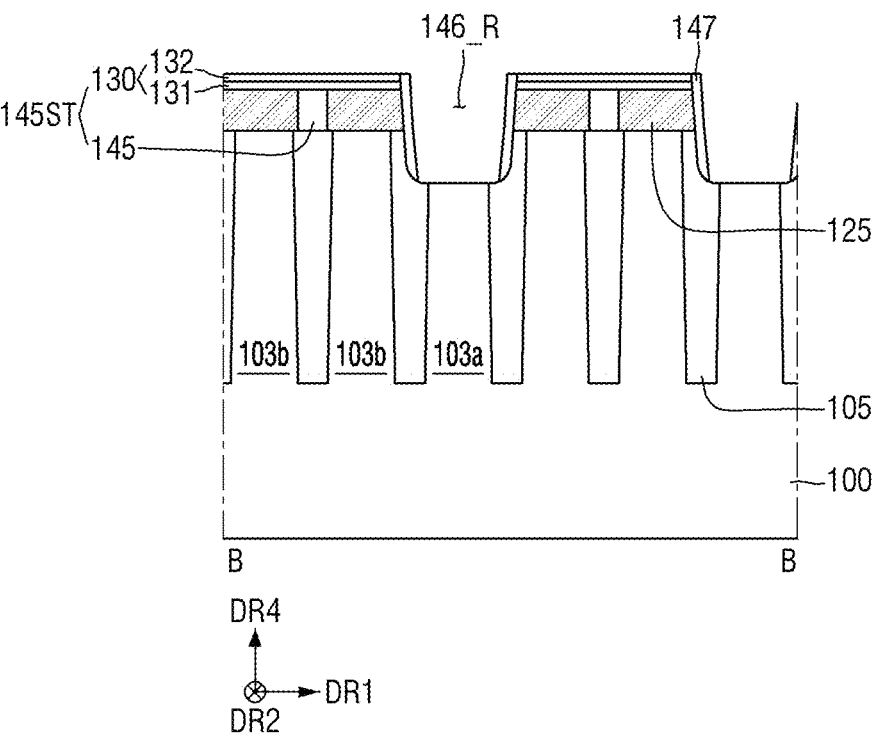

Referring to FIGS. 30 and 31, a bit line contact recess 146_R is formed in the substrate 100 by using the upper cell insulating layer 130 as a mask.

The pad isolation pattern 145 and the node connection pad 125 exposed through the bit line contact opening 130_OP are etched. Subsequently, the substrate 100, the cell element isolation layer 105, and the cell gate capping pattern 113 overlapping the bit line contact opening 130_OP may be removed.

Through this, the bit line contact recess 146_R is formed in an area corresponding to the bit line contact opening 130_OP.

Subsequently, a bit line contact spacer 147 is formed along a sidewall of the bit line contact recess 146_R.

The bit line contact recess 146_R exposes a portion of the substrate 100. The bit line contact recess 146_R exposes the bit line connection portion 103a.

Figure 32:
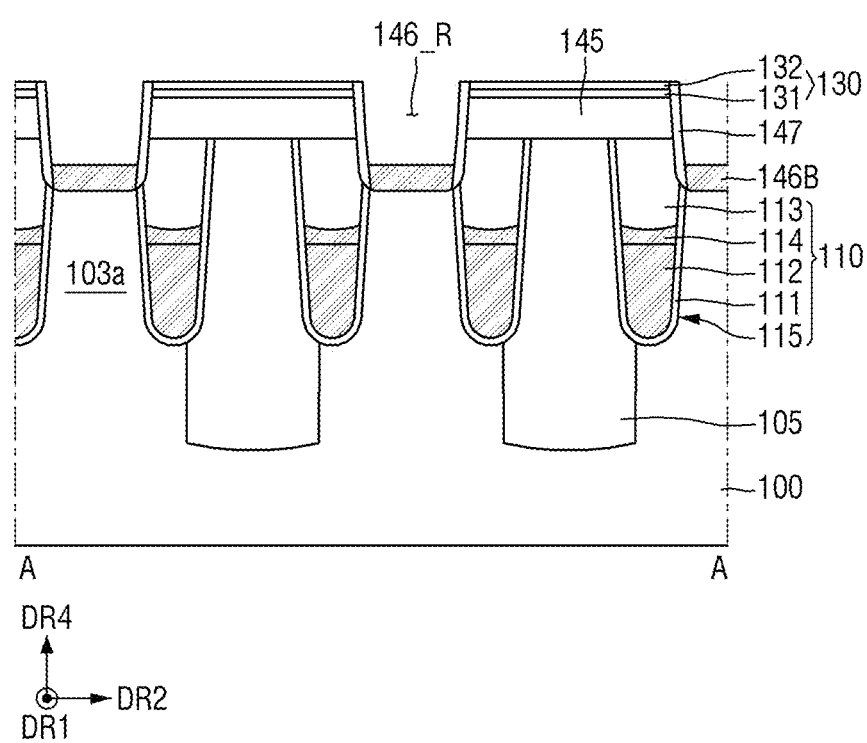
Figure 33:
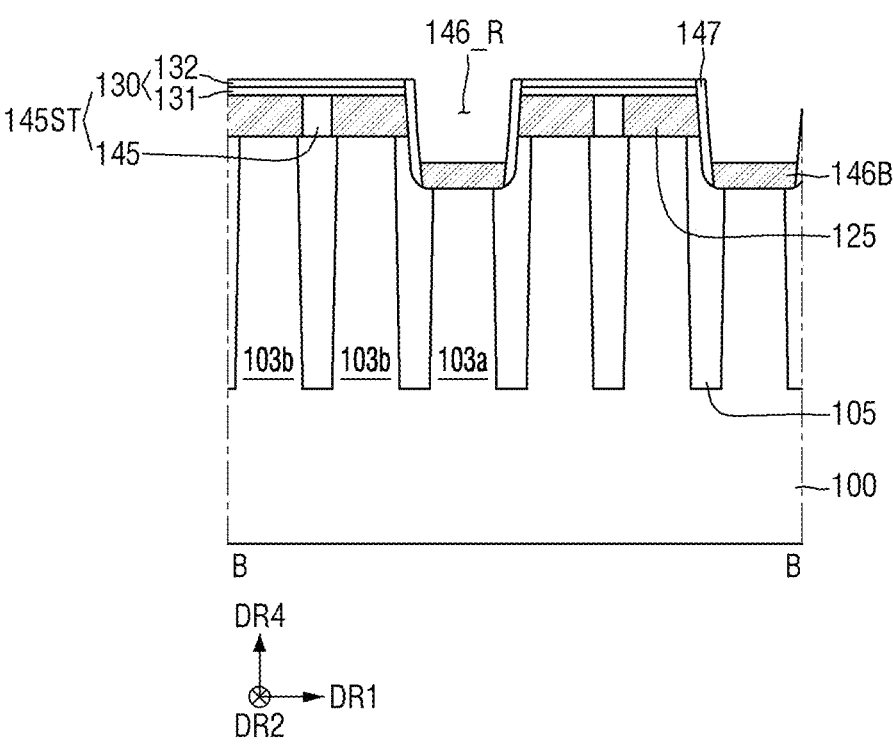

Referring to FIGS. 32 and 33, a lower bit line contact 146B is formed in the bit line contact recess 146_R.

The lower bit line contact 146B is formed using an epitaxial growth method. The lower bit line contact 146B fills a portion of bit line contact recess 146_R. The lower bit line contact 146B covers a portion of the first bit line contact spacer 147.

Figure 34:
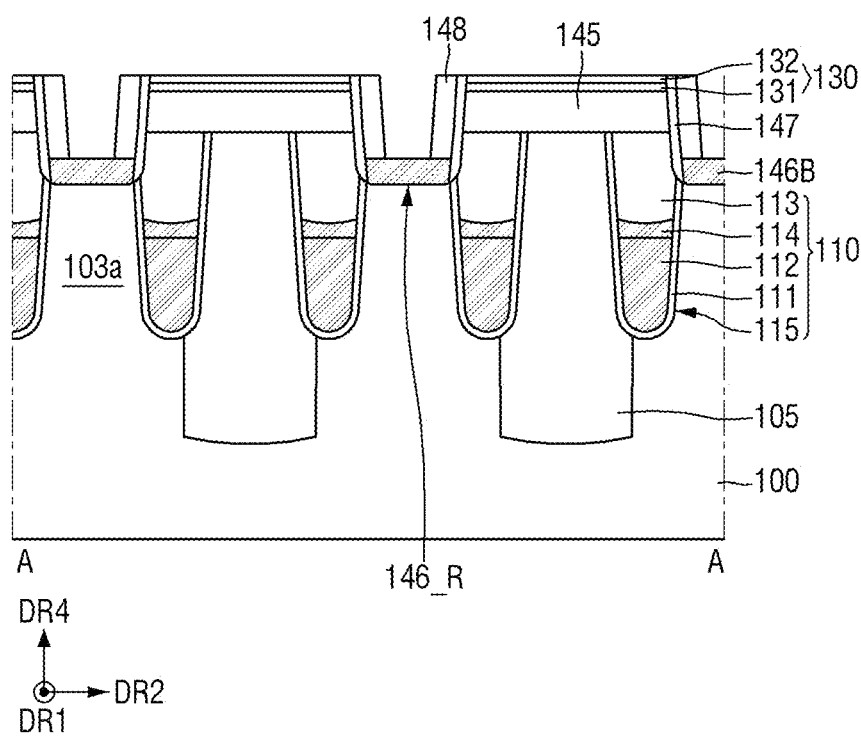
Figure 35:
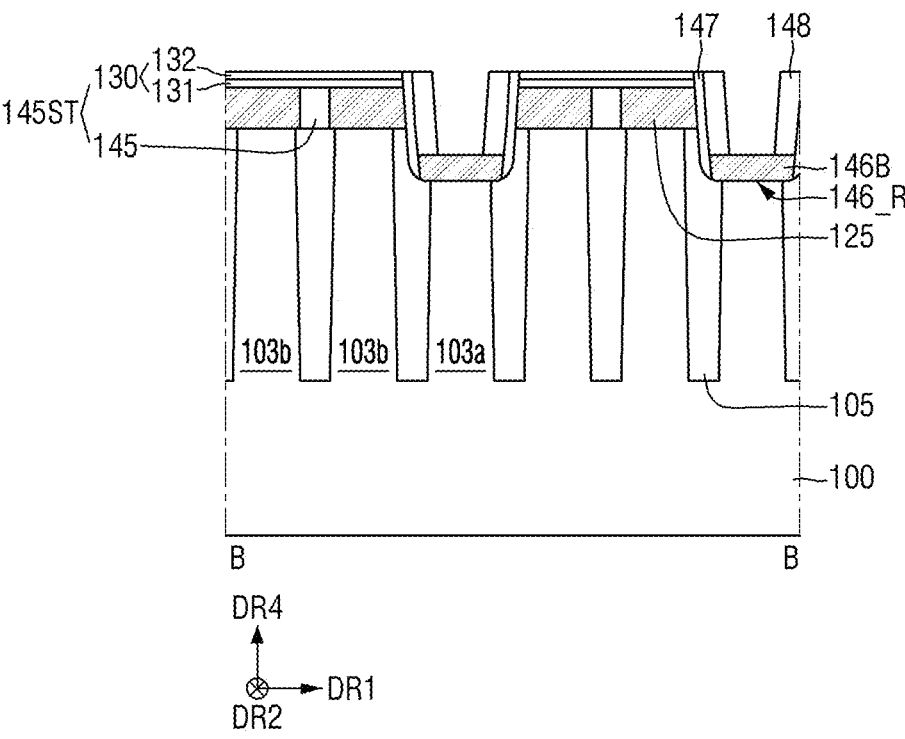

Referring to FIGS. 34 and 35, a second bit line contact spacer 148 is formed on the lower bit line contact 146B.

The second bit line contact spacer 148 covers a portion of an upper surface of the lower bit line contact 146B. The second bit line contact spacer 148 is formed along a sidewall of the bit line contact recess 146_R. The second bit line contact spacer 148 is formed along the remainder of the first bit line contact spacer 147. The second bit line contact spacer 148 may be in contact with the first bit line contact spacer 147.

Figure 36:
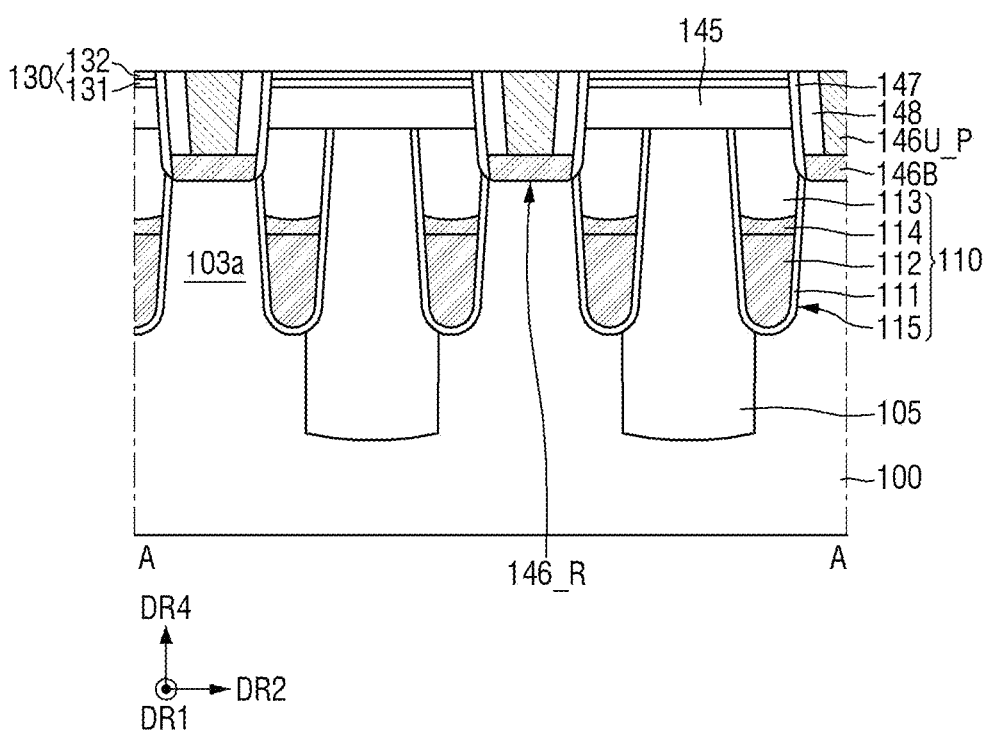
Figure 37:
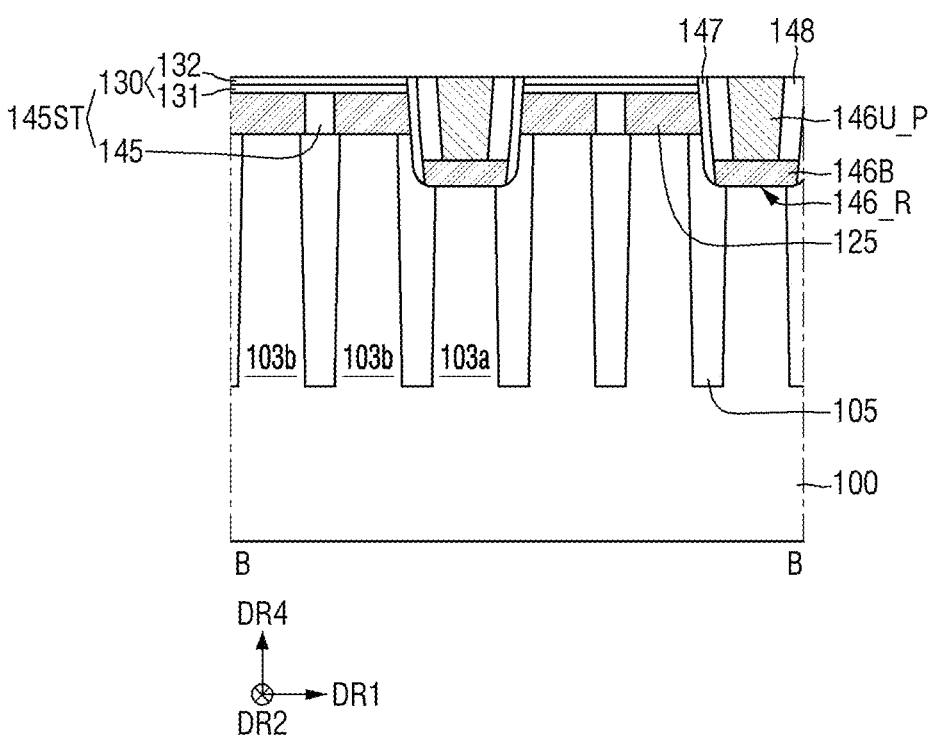

Referring to FIGS. 36 and 37, an upper contact layer 146U_P is formed on the lower bit line contact 146B.

The upper contact layer 146U_P fills the bit line contact recess 146_R. The second bit line contact spacer 148 is disposed between the first bit line contact spacer 147 and the upper contact layer 146U_P.

The upper contact layer 146U_P is in contact with the lower bit line contact 146B. The upper contact layer 146U_P may be formed through a deposition process.

The upper contact layer 146U_P is illustrated as not covering the upper surface of the upper cell insulating layer 130, but it is only for convenience of explanation and the present disclosure is not limited thereto.

Figure 38:
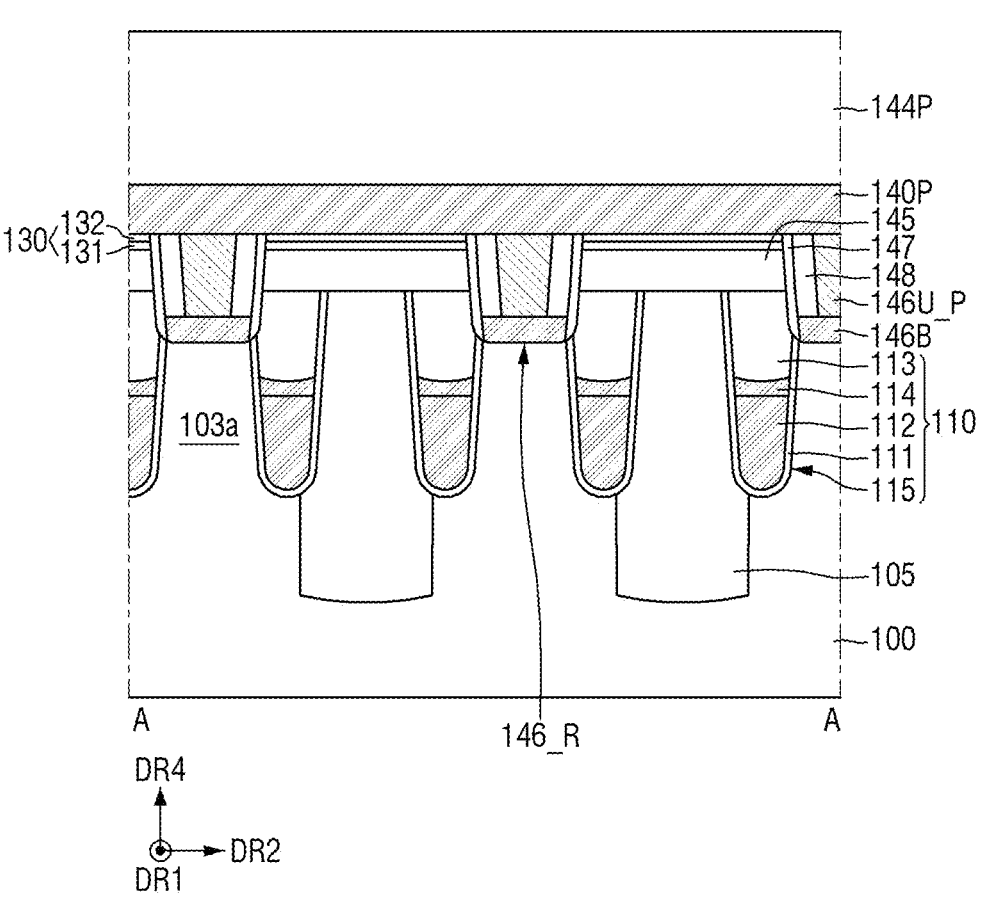
Figure 39:
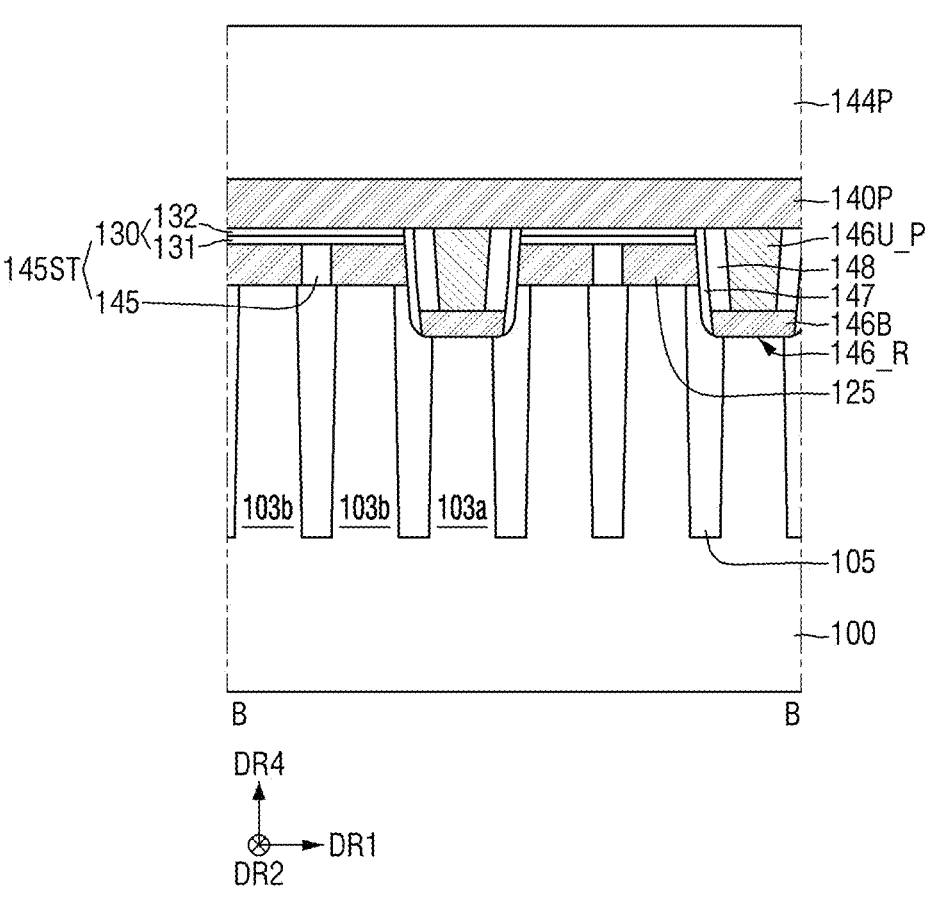

Referring to FIGS. 38 and 39, a cell conductive layer 140P and a cell capping layer 144P may be formed on the upper contact layer 146U_P and the upper cell insulating layer 130.

Subsequently, referring to FIGS. 3 and 4, a cell conductive line 140 and a cell line capping layer 144 are formed by patterning the cell capping layer 144P and the cell conductive layer 140P. That is, a bit line structure 140ST extending to be long in the second direction DR2 is formed.

In addition, the upper contact layer 146U_P may be patterned to form an upper bit line contact 146U.

Subsequently, a bit line spacer 150 and a storage pad 160 may be formed. In addition, an information storage portion 190 connected to the storage pad 160 may be formed on the storage pad 160.

While some example embodiments of the present disclosure have been described above with reference to the accompanying drawings, inventive concepts may be implemented in various different forms. Those skilled in the art to which the present disclosure pertains may understand that embodiments of inventive concepts may be implemented in other specific forms without departing from the spirit and scope of inventive concepts. Therefore, it should be understood that the example embodiments described above are illustrative in all aspects and not restrictive.

What is claimed is:

1. A semiconductor memory device comprising:
a substrate;
an element isolation layer on the substrate, the element isolation layer defining an active area of the substrate;
a word line crossing the active area, the word line extending in a first direction;
a bit line crossing the active area, the bit line extending in a second direction on the substrate, the second direction different from the first direction; and
a bit line contact directly connected to the bit line and the active area, the bit line contact between the substrate and the bit line,
wherein the bit line contact includes a lower bit line contact directly connected to the active area and an upper bit line contact on the lower bit line contact,
the lower bit line contact is in contact with the upper bit line contact, and
a width of an upper surface of the lower bit line contact in the second direction is greater than a width of a lower surface of the upper bit line contact in the second direction.

2. The semiconductor memory device of claim 1, further comprising:
a first bit line contact spacer on a sidewall of the lower bit line contact and in contact with the sidewall of the lower bit line contact,
wherein the first bit line contact spacer protrudes from the upper surface of the lower bit line contact.

3. The semiconductor memory device of claim 2, further comprising:
a second bit line contact spacer extending along a sidewall of the upper bit line contact,
wherein the second bit line contact spacer covers a portion of the upper surface of the lower bit line contact, and
the second bit line contact spacer is between the first bit line contact spacer and the upper bit line contact.

4. The semiconductor memory device of claim 1, wherein an upper surface of the bit line contact is higher than a lower surface of the bit line over an upper surface of the element isolation layer.

5. The semiconductor memory device of claim 1, wherein an upper surface of the bit line contact is on a same plane as a lower surface of the bit line.

6. The semiconductor memory device of claim 1, wherein the upper surface of the lower bit line contact is a flat surface in cross-sectional view.

7. The semiconductor memory device of claim 1, wherein the upper surface of the lower bit line contact includes a facet in a cross-sectional view.

8. The semiconductor memory device of claim 1, wherein the lower bit line contact covers a portion of a sidewall of the upper bit line contact.

9. The semiconductor memory device of claim 1, wherein the bit line contact further includes an impurity pile-up area in which impurities are piled up along an interface between the lower bit line contact and the upper bit line contact, and the impurities include at least one of carbon and nitrogen.

10. A semiconductor memory device comprising:

a substrate;

an element isolation layer on the substrate, the element isolation layer defining an active area of the substrate, the active area of the substrate including a first portion and a second portion, the first portion at a central region of the active area, and the second portion at both sides of the active area;

a bit line extending in a first direction on the substrate;

a bit line contact between the substrate and the bit line, the bit line contact directly connected to the first portion of the active area, the bit line contact including a lower contact area and an upper contact area on the lower contact area; and a bit line spacer on the lower contact area of the bit line contact, the bit line spacer extending along a sidewall of the upper contact area of the bit line contact and a sidewall of the bit line, wherein a width of the lower contact area in a second direction is greater than a width of the upper contact area in the second direction at a boundary between the lower contact area and the upper contact area.

11. The semiconductor memory device of claim 10, wherein the bit line contact includes a lower bit line contact directly connected to the first portion of the active area and an upper bit line contact on the lower bit line contact, and the lower bit line contact is in contact with the upper bit line contact.

12. The semiconductor memory device of claim 11, wherein the upper contact area includes a portion of the lower bit line contact and the upper bit line contact.

13. The semiconductor memory device of claim 11, wherein the boundary between the lower contact area and the upper contact area is an interface between the lower bit line contact and the upper bit line contact.

14. The semiconductor memory device of claim 10, further comprising:

a bit line contact spacer extending along a sidewall of the bit line spacer and a sidewall of the lower contact area.

15. The semiconductor memory device of claim 10, wherein the bit line contact further includes an impurity pile-up area in which impurities are piled up, and the impurities include at least one of carbon and nitrogen.

16. The semiconductor memory device of claim 10, further comprising:

a node connection pad on the substrate, the node connection pad connected to the second portion of the active area, wherein an upper surface of the node connection pad is lower than a lower surface of the bit line.

17. The semiconductor memory device of claim 16, further comprising:

a pad isolation pattern on the substrate; and an upper cell insulating layer on the pad isolation pattern and covering the upper surface of the node connection pad.

18. A semiconductor memory device comprising:

a substrate;

an element isolation layer on the substrate, the element isolation layer defining an active area of the substrate, the active area extending in a first direction, the active area including a first portion and a second portion, the first portion at a central region of the active area, and the second portion at both sides of the active area;

a word line on the substrate and the element isolation layer, the word line extending in a second direction and crossing between the first portion of the active area and the second portion of the active area;

a bit line contact connected to the first portion of the active area;

a node connection pad on the substrate and connected to the second portion of the active area;

a bit line connected to the bit line contact and extending in a third direction, the bit line on the bit line contact; and a capacitor on the node connection pad and connected to the node connection pad, wherein the bit line contact includes a lower bit line contact directly connected to the first portion of the active area and an upper bit line contact on the lower bit line contact, the lower bit line contact is in contact with the upper bit line contact, and a width of an upper surface of the lower bit line contact in the third direction is greater than a width of a lower surface of the upper bit line contact in the third direction.

19. The semiconductor memory device of claim 18, wherein the bit line contact further includes an impurity pile-up area in which impurities are piled up along an interface between the lower bit line contact and the upper bit line contact, and the impurities include at least one of carbon and nitrogen.

20. The semiconductor memory device of claim 18, further comprising:

a bit line contact spacer extending along a sidewall of the upper bit line contact, wherein the bit line contact spacer covers a portion of the upper surface of the lower bit line contact.

\*    \*    \*    \*    \*